US012684708B2

(12) United States Patent
Wen et al.

(10) Patent No.: US 12,684,708 B2
(45) Date of Patent: Jul. 14, 2026

(54) INFLATOR WITH ENERGY STORAGE POWER SOURCE

(71) Applicant: Shenzhen Fanttik Technology Innovation Co., Ltd., Shenzhen (CN)

(72) Inventors: Mingrong Wen, Shenzhen (CN); Qijie Shi, Shenzhen (CN); Zheyu Chen, Shenzhen (CN)

(73) Assignee: Shenzhen Fanttik Technology Innovation Co., Ltd., Shenzhen (CN)

( * ) Notice: Subject to any disclaimer, the term of this patent is extended or adjusted under 35 U.S.C. 154(b) by 21 days.

(21) Appl. No.: 18/913,998

(22) Filed: Oct. 11, 2024

(65) Prior Publication Data

US 2025/0133668 A1     Apr. 24, 2025

(30) Foreign Application Priority Data

Oct. 24, 2023    (CN) .......................... 202311390149.0

(51) Int. Cl.
  *H05K 5/00*    (2025.01)
  *H05K 5/02*    (2006.01)
(52) U.S. Cl.
  CPC ......... *H05K 5/0086* (2013.01); *H05K 5/0018* (2022.08); *H05K 5/0026* (2013.01); *H05K 5/023* (2013.01)
(58) Field of Classification Search
  CPC .. H05K 5/0086; H05K 5/0018; H05K 5/0026; H05K 5/023; F04D 25/0673; H05B 47/10; F04B 39/00; F04B 39/0044; F04B 39/06; F04B 39/066; F04B 39/121; F21V 33/00; G09F 9/00; H01H 13/70; H02J 7/0042
  See application file for complete search history.

(56) References Cited

U.S. PATENT DOCUMENTS

| | | | | |
|---|---|---|---|---|
| 1,647,818 A | * | 11/1927 | Semak | B60S 5/046 141/38 |
| 4,187,058 A | * | 2/1980 | Fish | F04B 35/04 D15/7 |
| 4,715,787 A | * | 12/1987 | Hung | F04B 35/06 417/313 |
| 4,830,579 A | * | 5/1989 | Cheng | F04B 35/06 362/225 |
| 2016/0226278 A1 | * | 8/2016 | Wenger | B25F 5/00 |
| 2019/0263363 A1 | * | 8/2019 | Mcintyre | F04B 49/065 |
| 2024/0360819 A1 | * | 10/2024 | Wen | F04B 39/0044 |

FOREIGN PATENT DOCUMENTS

| | | |
|---|---|---|
| CN | 109404269 A | 3/2019 |
| CN | 214616909 U | 11/2021 |
| CN | 214741914 U | 11/2021 |

OTHER PUBLICATIONS

First Office Action for CN202311390149.0 from CNIPA.

* cited by examiner

*Primary Examiner* — Hoang M Nguyen

(57)        ABSTRACT

An inflator with an energy storage power source includes: a housing having a top end face, a bottom end face and a number of sidewalls between the top end face and the bottom end face; a control circuit board arranged within the housing and having a display mounted thereon; a compressor assembly arranged within the housing and including a casing and a compressor arranged within the casing; a battery module arranged within the housing and electrically connected to the control circuit board and the compressor; and a mounting member connected to the housing.

20 Claims, 21 Drawing Sheets

INFLATOR WITH ENERGY STORAGE POWER SOURCE

CROSS REFERENCE TO RELATED APPLICATIONS

This application claims priority to Chinese Patent Application No. CN 202311390149.0, filed Oct. 24, 2023, which is hereby incorporated by reference herein as if set forth in its entirety.

TECHNICAL FIELD

The present disclosure generally relates to portable inflators, and in particular relates to an inflator with an energy storage power source.

BACKGROUND

Currently, there are few types of inflators on the market that can inflate pickup trucks, and they typically have slow inflation speeds and limited functionality—often offering only basic inflation or inflation with simple auxiliary lighting. Users need to carry separate devices like inflators and power storage boxes for outdoor camping, which makes it inconvenient to transport and store these items. Given the growing popularity of road trip and camping, there is a lack of a portable, multifunctional product that can both inflate pickup trucks and serve as a power storage source.

Therefore, there is a need to provide an inflator with an energy storage power source to overcome the above-mentioned problems.

BRIEF DESCRIPTION OF DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
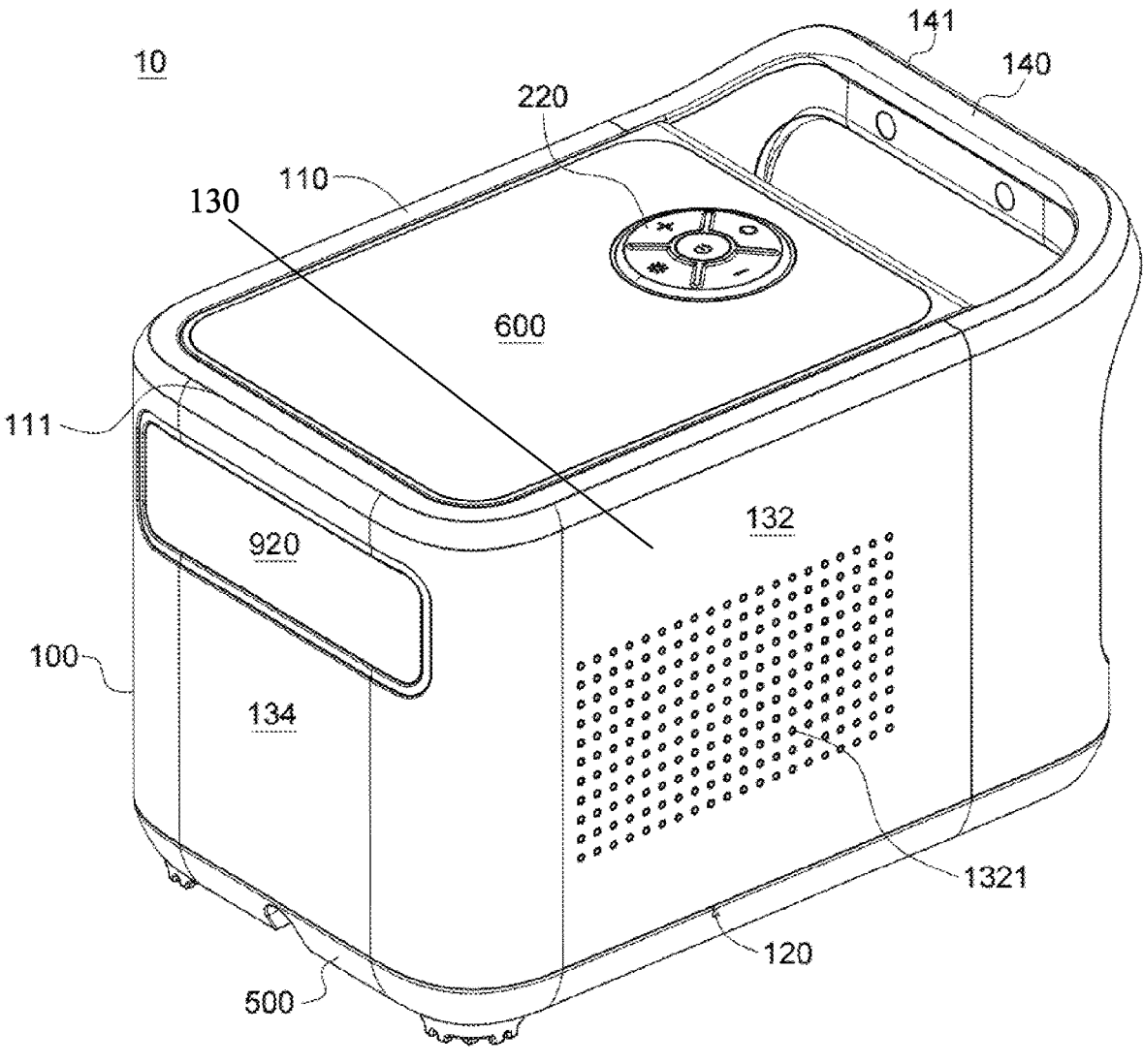
FIG. 1 is an isometric view of an electric inflator according to one embodiment.
Figure 2:
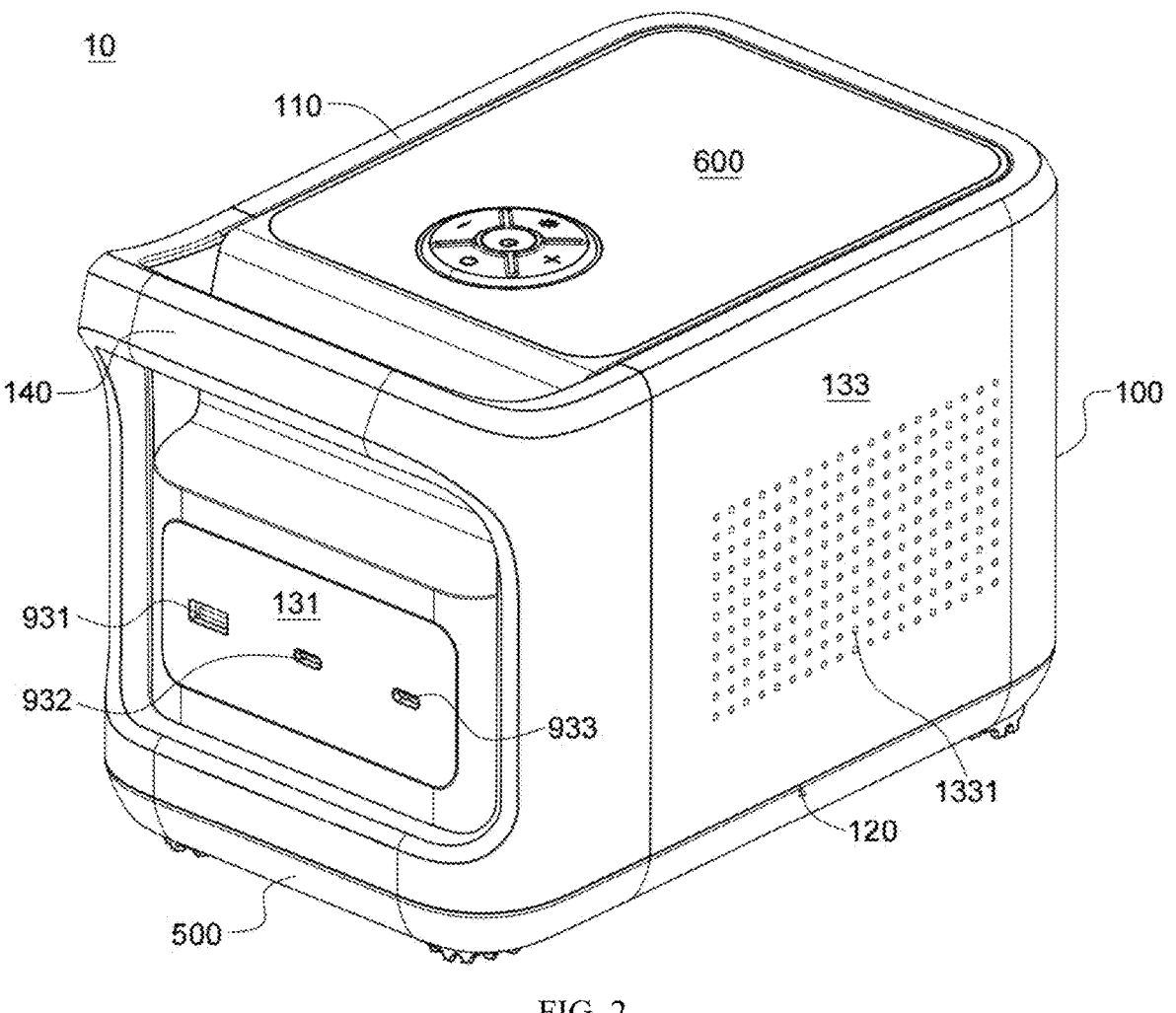
FIG. 2 is an isometric view of the electric inflator viewed from a different perspective.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one" embodiment.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

Referring to FIGS. 1 to 4, in one embodiment, an inflator 10 with an energy storage power source may include a housing 100, a control circuit board 200, a battery module 300, a compressor assembly 400 and a mounting member 500.

In one embodiment, the housing 100 may include a top end face 110, a bottom end face 120 and a number of sidewalls 130 between the top end face 110 and the bottom end face 120. In one embodiment, the housing is integrally formed. The control circuit board 200, battery module 300, compressor assembly 400, and mounting member 500 are arranged sequentially from the top end face 110 to the bottom end face 120 of the housing 100. It should be noted that the arrangement of the control circuit board 200, battery module 300, compressor assembly 400, and mounting member 500 is not limited, and can be changed according to actual needs. For example, when there is ample internal space within the housing 100, the control circuit board 200 can be placed at a position facing a longitudinal end of the compressor assembly 400, while the battery module 300, compressor assembly 400, and mounting member 500 are arranged sequentially from the top end face 110 to the bottom end face 120 of the housing 100.

In one embodiment, the housing 100 is substantially cuboid, and the sidewalls 130 of the housing 100 includes a first sidewall 131, a second sidewall 132, a third sidewall 133, and a fourth sidewall 134. The first sidewall 131 is disposed opposite to the fourth sidewall 134, and the second sidewall 132 is disposed opposite to the third sidewall 133. In an alternative embodiment, the housing 100 may be in a cylindrical shape or a pentagonal prism shape.

In one embodiment, the housing 100 further includes a handle 140, which is disposed at the intersection of the top end face 110 and one or more of the sidewalls 130. In one embodiment, opposite ends of the handle 140 are connected to the sidewalls 130 of the housing 100. Specifically, the handle 140 is formed at the intersection of the top end face 110 and two first sidewalls 131 of the housing 100, and opposite ends of the handle 140 are respectively connected to the second sidewall 132 and the third sidewall 133. It should be noted that the number of handles is not limited to one, nor is it restricted to the position and structural form shown in the foregoing embodiment. For example, there can be two handles, which can be located at any position on the first sidewall 131, the second sidewall 132, the third sidewall 133, or the fourth sidewall 134. The handles can also be structured as pivotally connected or telescopically connected.

In one embodiment, the inflator 10 further includes a light-transmitting panel 600, which is disposed on the top end face 110 of the housing 100. The light-transmitting panel 600 covers most of the area of the top end face 110 of the housing 100. Specifically, the ratio of the area of the top end face 110 of the housing 100 covered by the light-transmitting panel 600 to the area of the top end face 110 of the housing 100 is greater than two-thirds.

In one embodiment, the control circuit board 200 may include a number of switches 210. A button panel 220 is arranged at the top end face 110 of the housing 100. The button panel 220 may include a number of buttons that are to respectively actuate the switches 210 when depressed by a user. In one embodiment, the light-transmitting panel 600 defines a through hole 610 to expose the button panel 200. The bottom of the button panel 220 faces the switches 210, and the top of the button panel 220 protrudes from the light-transmitting panel 600 through the through hole 610. A user can actuate the switches 210 by operating the button panel 220 to control the power on and off and set the air pressure of the compressor assembly 400. In one embodiment, the control circuit board 200 further includes a display 230 to display information that is viewable by a user from the top end face 110 of the housing 100. Specifically, a user can see through the light-transmitting panel 600 and view the visual information displayed on the display 230 from the top end face 110 of the housing 100.

The arrangement of the button panel 220 and the light-transmitting panel 600 is not limited. In an alternative embodiment, the button panel 220 can be arranged at intervals from the light-transmitting panel 600. In this case, the light-transmitting panel 600 does not need to have the through hole 610.

The switches 210 are not limited to the mechanical switches discussed above. In an alternative embodiment, the control circuit board 200 may include a number of touch sensitive components, and the key panel 220 can be replaced by a touch panel. In this case, a touch on the touch panel from a user can be detected by each of the touch sensitive components, thereby controlling the power on and off and setting the air pressure of the compressor component 400.

Figure 4:
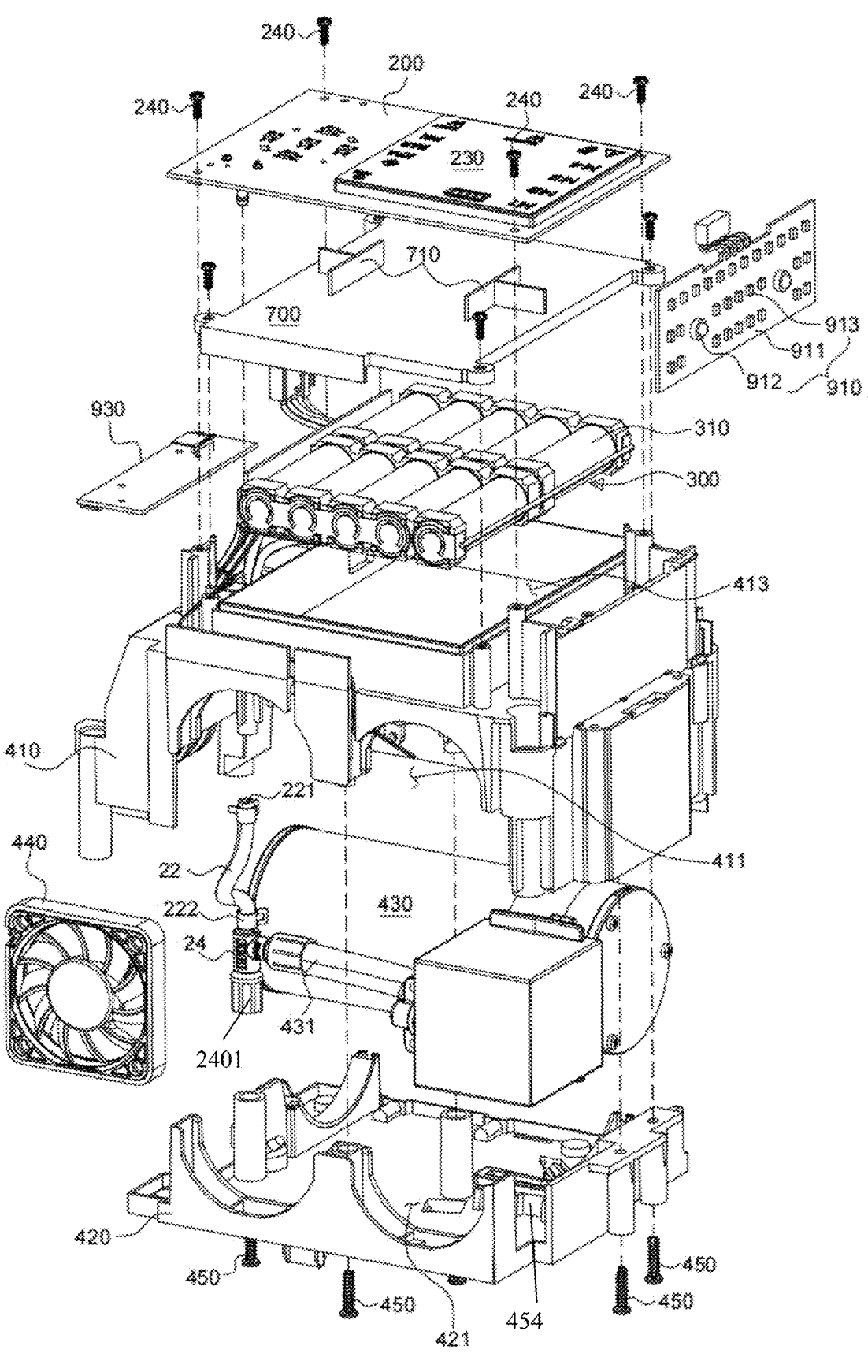
FIG. 4 is another isometric exploded view of the electric inflator with certain components omitted.

In one embodiment, the compressor assembly 400 may include a casing, a compressor 430 and a cooling fan 440. The casing may include an upper casing 410 and a lower casing 420 securely connected to each other. For example, the upper casing 410 and the lower casing 420 can be securely connected to each other using screws 450, snap-fit connectors, or a combination of both. It should be noted that the two casing halves of the casing are not limited to being stacked on each other in the vertical direction as shown in FIG. 4. When necessary, the two casing halves can be arranged in the horizontal direction.

Figure 5:
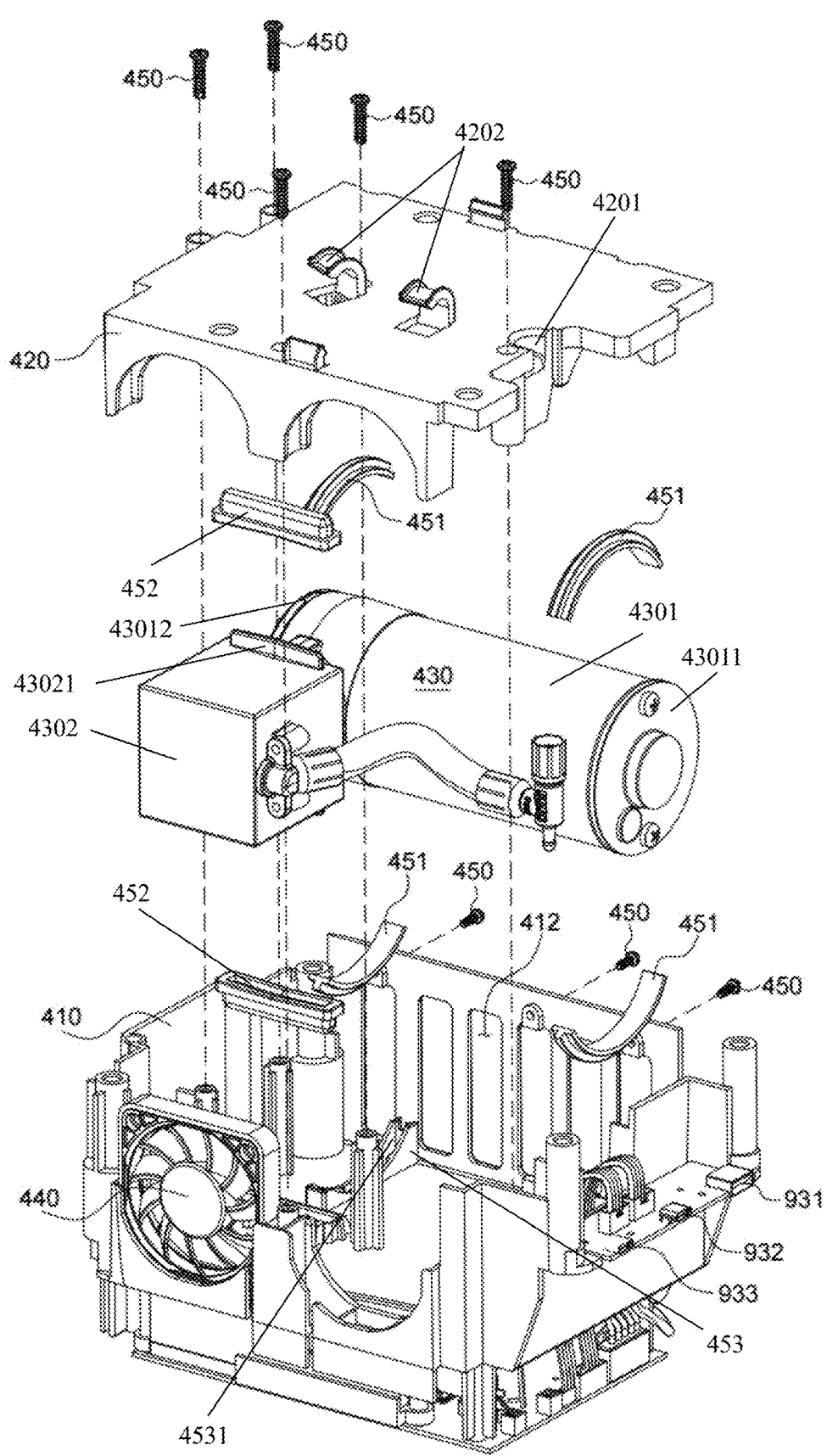
FIG. 5 is another isometric exploded view of the electric inflator with certain components omitted.

Referring to FIG. 5, in one embodiment, the compressor assembly 400 further includes one or more spacers 451 disposed between the compressor 430 and the casing, which serves to provide vibration damping and thermal insulation. Specifically, the compressor 430 is sandwiched between the upper casing 410 and the lower casing 420, and a number of spacers 451 can be disposed at different positions between the compressor 430 and the upper casing 410 and the lower casing 420. In one embodiment, the spacers 451 are made of elastic material (e.g., rubber), which can effectively reduce the transmission of vibrations generated by the compressor 430 when it is working to other parts of the inflator 10, thereby lowering the user's perception of vibrations while using the inflator 10.

Figure 6:
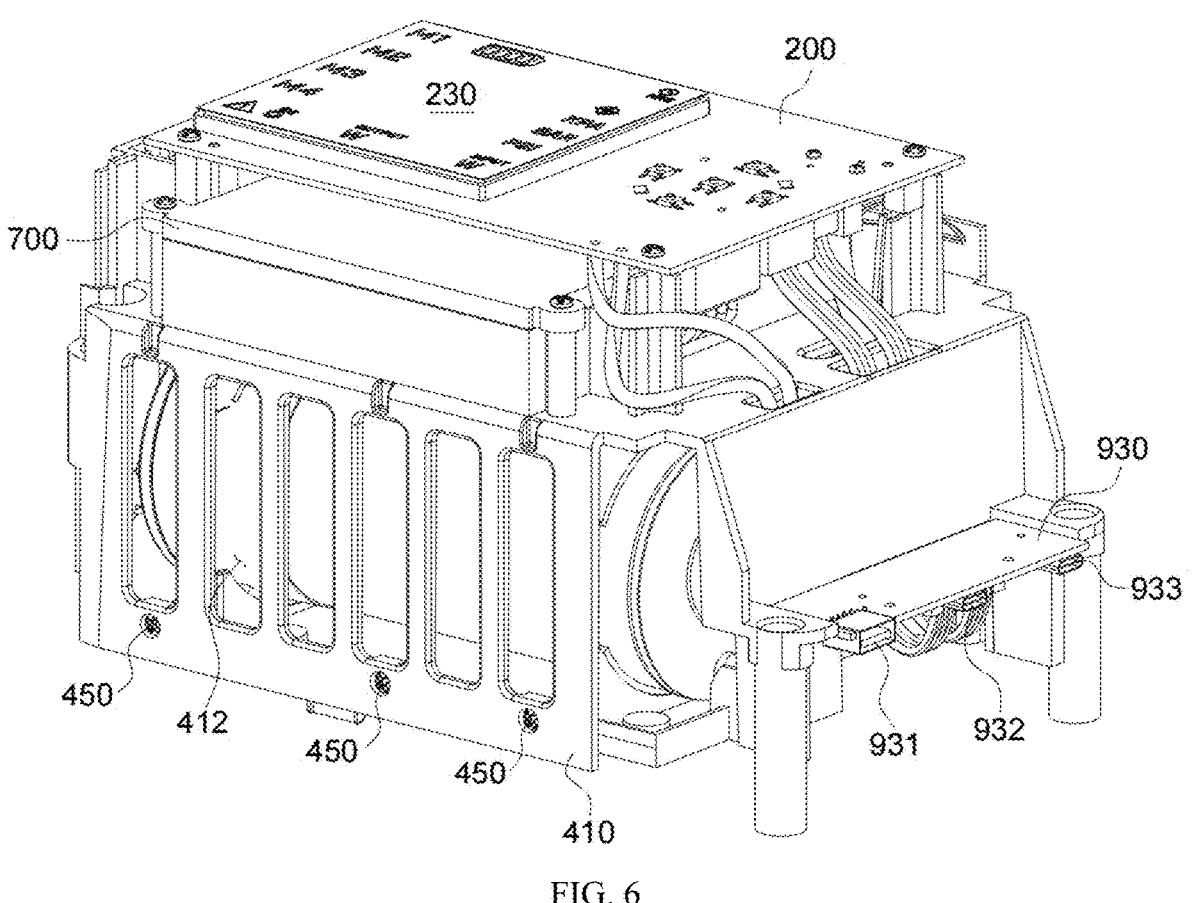
FIG. 6 is an isometric view of the assembly in FIG. 3.

The compressor 430 generates heat when working for a long time, and the cooling fan 440 electrically connected to the battery module 300 and arranged between the upper casing 410 and the lower casing 420 can dissipate heat for the compressor 430. Specifically, a first mounting groove 411 is formed adjacent to an edge of the upper casing 410, and a second mounting groove 421 is formed adjacent to an edge of the lower casing 420. The first mounting groove 411 and the second mounting groove 421 are combined to form a mounting groove for the cooling fan 440. As shown in FIGS. 5 and 6, the other opposite edge of the upper casing 410 is provided with a sidewall defining a number of through holes 412 so that the airflow moved by the cooling fan 440 when working can pass through the through holes 412. The second sidewall 132 of the housing 100 is formed with a number of heat dissipation holes 1321, and the through holes 412 face the heat dissipation holes 1321. The third sidewall 133 of the housing 100 is formed with a number of heat dissipation holes 1331, and the cooling fan 440 faces the heat dissipation holes 1331. The mounting groove formed by the first mounting groove 411 and the second mounting groove 421 and the through holes 412 constitute ventilation holes formed on the casing of the compressor assembly 400, and the ventilation holes allow air flow to flow into the interior of the casing and then flow out of the casing after flowing over the compressor 430, thereby taking away part of the heat generated by the compressor 430.

Figure 16:
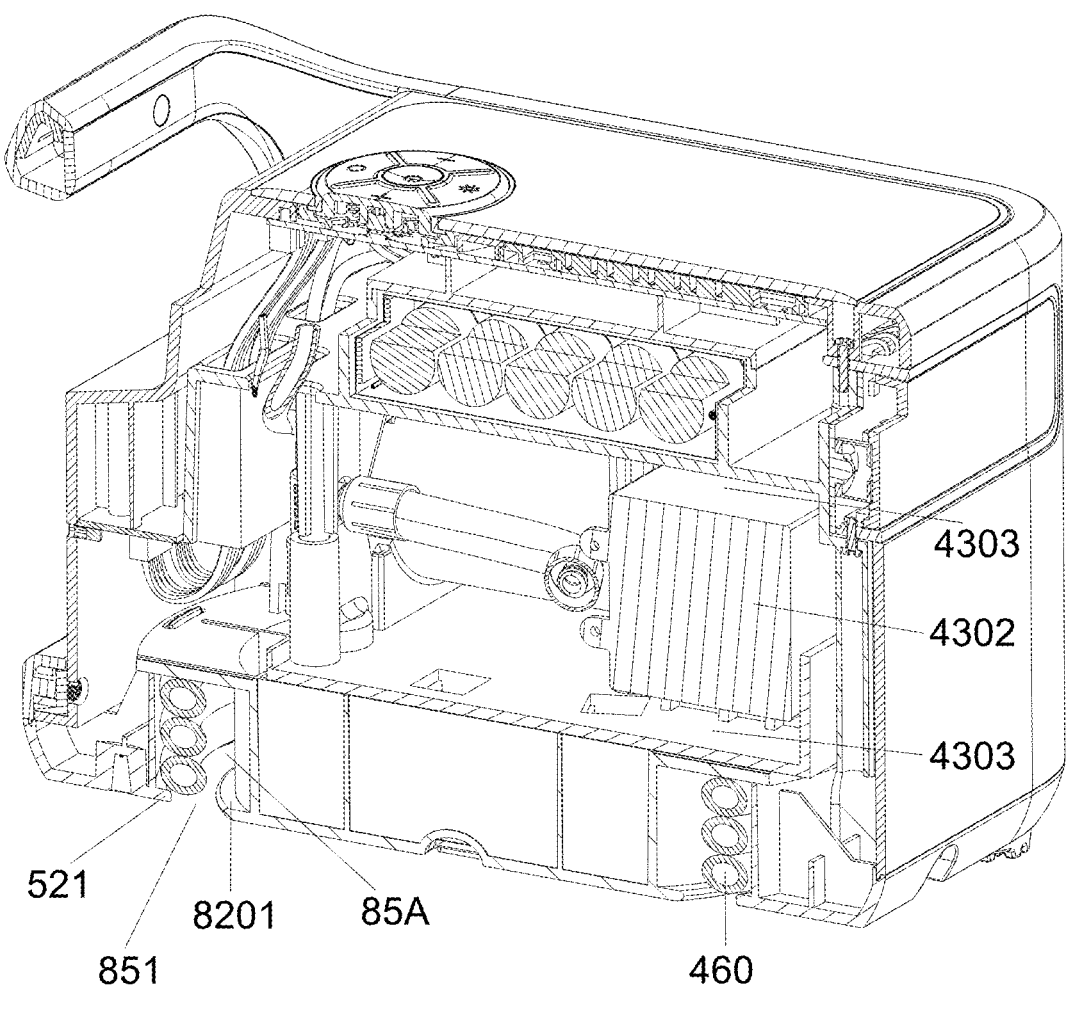
FIG. 16 is an isometric cross-sectional view of the electric inflator.
Figure 19:
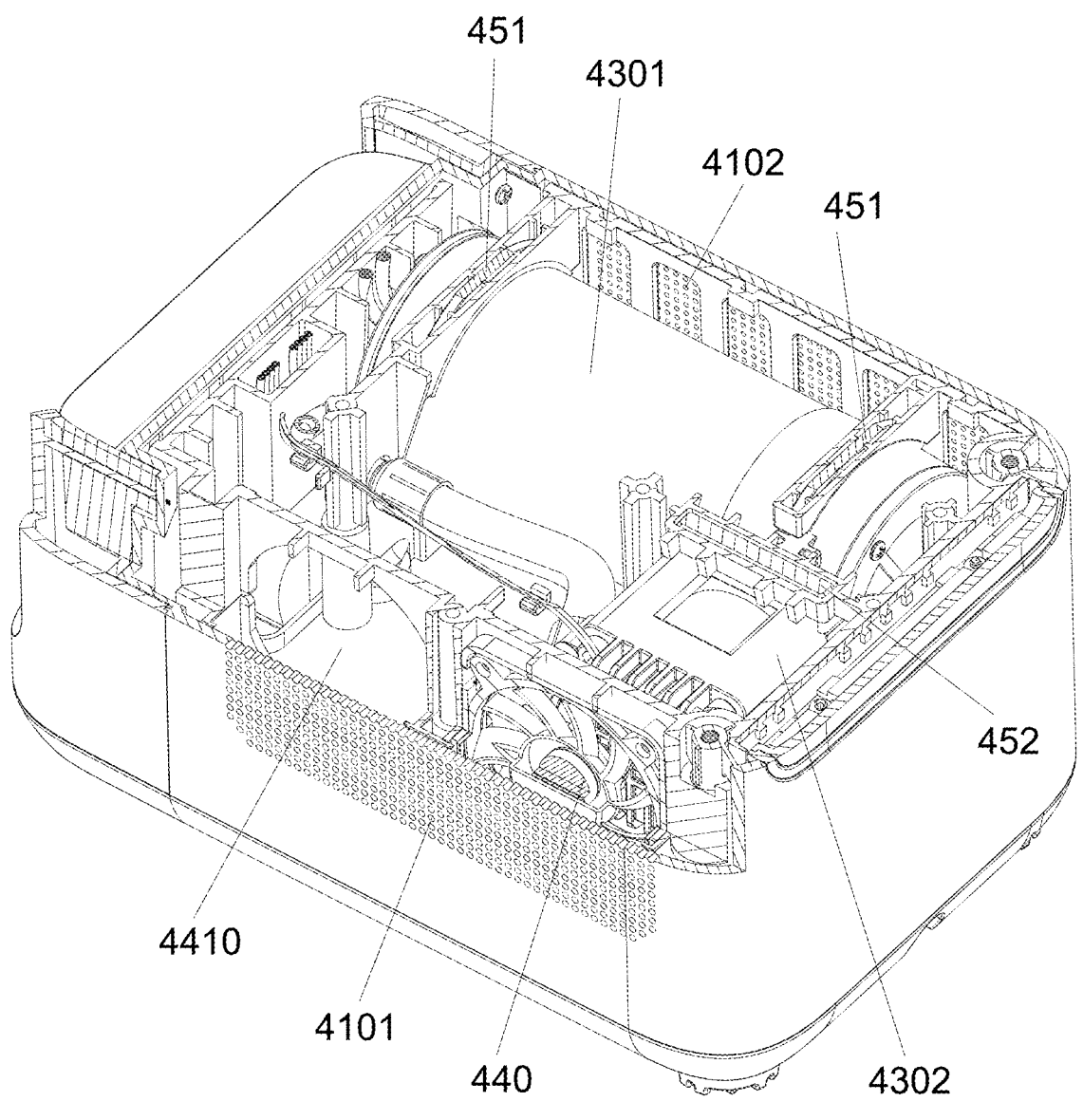
FIG. 19 is another isometric cross-sectional view of the electric inflator.
Figure 20:
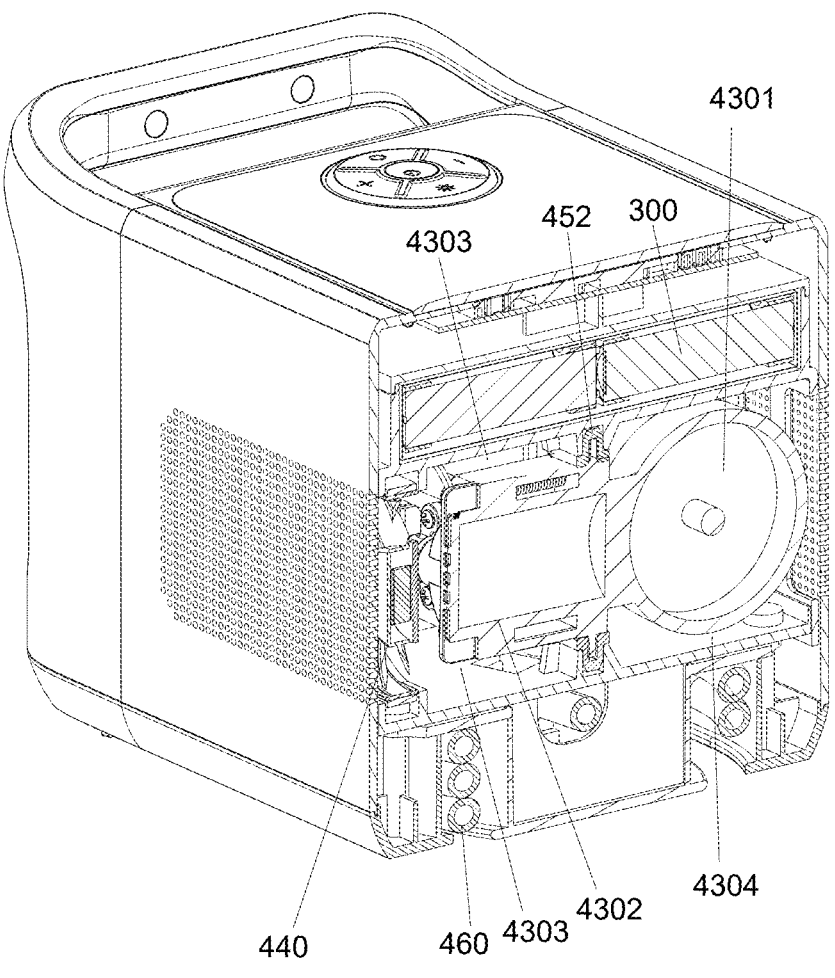
FIG. 20 is another isometric cross-sectional view of the electric inflator.
Figure 21:
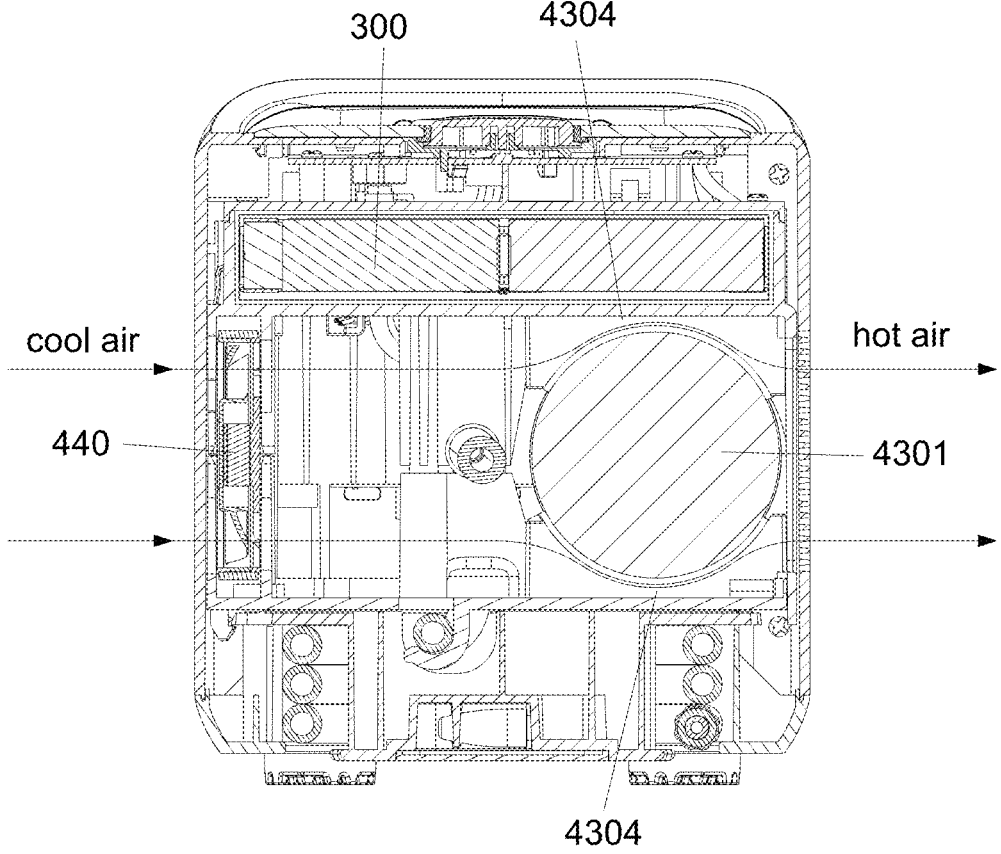
FIG. 21 is a planar cross-sectional view of the electric inflator.

Specifically, referring to FIG. 5, the compressor 430 includes a motor 4301 and a cylinder 4302 connected to the motor 4301. The motor 4301 and the cylinder 4302 roughly form an L-shaped structure. Referring to FIGS. 19 and 20, the cylinder 4302 is arranged opposite to the cooling fan 440. When the cooling fan 440 is working, the air flow blows directly to the end of the cylinder 4302. Referring to FIGS. 5 and 16, the top and bottom surfaces of the cylinder 4302 are spaced from the upper casing 410 and the lower casing 420 by two spacers 452 fixed on the upper casing 410 and the lower casing 420. The spacers 452 are made of an elastic material (e.g., rubber). Therefore, there is a gap 4303 between the cylinder 4302 and the upper casing 410 and the lower casing 420. Referring to FIGS. 5, 20 and 21, similarly, the motor 4301 is spaced from the upper casing 410 and the lower casing 420 by the spacers 451. Thus, there is a gap 4304 between the motor 4301 and the upper casing 410 and the lower casing 420. The first side surface of the upper casing 410 close to the cooling fan 440 is provided with a number of ventilation holes 4101, and the second side surface of the upper casing 410 close to the motor 4301 is provided with a number of ventilation holes 4102.

With such a configuration, when the cooling fan 440 is working, the outside air enters the interior of the upper casing 410 through the ventilation holes 4101 of the upper casing 410 in sequence, and then flows toward the cylinder 4302 driven by the cooling fan 440, and the heat generated by the cylinder 4302 when working is transferred to the above-mentioned airflow, which flows to the outside of the upper casing 410 through the ventilation holes 4102 of the upper casing 410 after passing through the gaps 4303 and 4304. In this way, the heat generated by the cylinder 4302 when working can be discharged to the external environment in time, which is conducive to the normal operation of the compressor 430.

In one embodiment, referring to FIG. 19, in order to further improve the heat dissipation efficiency, the inflator 10 may further include a cooling fan (not shown) arranged side by side with the cooling fan 440, and the cooling fan is arranged in the mounting hole 4410 arranged side by side with the cooling fan 440. By appropriately setting the position and size of the mounting hole 4410, the cooling fan can face the lateral surface of the motor 4301. Thus, when the cooling fan is working, the outside air enters the interior of the upper casing 410 through the ventilation holes 4101 of the upper casing 410 in sequence, and then flows toward the motor 4301 driven by the cooling fan, and the heat generated by the motor 4301 when working is transferred to the above-mentioned airflow, and the above-mentioned airflow passes through the gap 4304 and flows to the outside of the upper casing 410 through the ventilation holes 4102 of the upper casing 410. In this way, the heat generated by the motor 4301 when working can be discharged to the external environment in time, which is conducive to the normal operation of the compressor 430.

In one embodiment, the battery module 300 is electrically connected to the control circuit board 200 and the compressor 430, and the battery module 300 is to provide power for the compressor 430 when it is working. The top of the upper casing 410 is provided with a battery chamber 413 and a cover 700. The battery module 300 is arranged in the battery chamber 413 and the cover 700 covering the battery chamber 413, providing dustproof and waterproof. The battery module 300 includes a number of battery cells 310 that are arranged adjacent to each other and laid flat in the battery chamber 413.

Since the battery module 300 is accommodated in the battery chamber 413, and the cover 700 covers the open end of the battery chamber 413, the battery module 300 is accommodated in a closed receiving chamber. That is to say, the battery chamber 413 is isolated from the internal space formed by the upper casing 410 and the lower casing 420 for accommodating the compressor 430, and there is no through hole on the upper casing 410 that makes the battery chamber 413 and the internal space be in communication with each other. In this way, the battery module 300 is physically isolated from the compressor 430. Furthermore, as mentioned above, there is a gap 4303 between the cylinder 4302 and the upper casing 410, and there is a gap 4304 between the motor 4301 and the upper casing 410 and the lower casing 420. These gaps further hinder the heat generated by the compressor 430 when it is working from being quickly transferred to the battery module 300.

Referring to FIG. 5, as mentioned above, multiple spacers 451 and 452 are arranged at different positions between the compressor 430 and the upper casing 410 and the lower casing 420. In one embodiment, the material of the spacers 451 and 452 is a high-temperature resistant silicone material, which can not only play a shock-absorbing role but also provide heat insulation, which is beneficial to prevent the heat generated by the compressor 430 during operation from being directly transferred to the battery chamber 413 and the battery module 300.

With the above-mentioned configuration, the battery module 300 is physically isolated from the compressor 430, and there is a gap 4303 between the cylinder 4302 and the upper casing 410, and there is a gap 4304 between the motor 4301 and the upper casing 410 and the lower casing 420. The combination of these structures is conducive to preventing the heat generated by the compressor 430 during operation from being directly transferred to the battery module 300, thereby preventing the battery module 300 from operating at an extreme temperature (i.e., above 60 degrees), which is conducive to ensuring the normal capacity of the battery module 300 and extending the service life of the battery module 300.

As can be seen from the above description, in order to achieve shock absorption, spacers need to be arranged between the compressor 430 and the upper casing 410 and the lower casing 420. Here, the spacers between the compressor 430 and the upper casing 410 are referred to as the first group of spacers, and the spacers between the compressor 430 and the lower casing 420 are referred to as the second group of spacers. In other words, the compressor 430 is located between the first group of spacers and the second group of spacers.

Since the battery module 300 is accommodated in the battery chamber 413 located at the top of the upper casing 410, the first group of spacers is located between the battery module 300 and the compressor 430, so that the first group of spacers separate the battery module 300 from the compressor 430. This arrangement is conducive to reducing the heat transfer from the compressor 430 to the battery module 300.

The first group of spacers has at least one spacer, and the second group of spacers has at least one spacer. In one embodiment, referring to FIG. 5, in order to better adapt to the structure of the compressor 430 (i.e., including a cylindrical motor and a cylinder connected to the lateral surface of the motor), the first group of spacers includes two spacers 451 and one spacer 452, and the second group of spacers includes two spacers 451 and one spacer 452.

In one embodiment, the spacers 451 are arc-shaped so that they can adapt to and contact the cylindrical surface of the motor 4301. In this way, the motor 4301 is tightly clamped by two or more spacers 451 in the first group of spacers and two or more spacers 451 in the second group of spacers, thereby achieving vibration reduction while fixing the motor 4301.

Referring to FIG. 5, in one embodiment, the motor 4301 is supported by two pairs of spacers 451. Specifically, the first pair of spacers 451 fits the lateral surface of the motor 4301 and is close to the first end 43011 of the motor 4301 in its length direction. The second pair of spacers 451 fits the lateral surface of the motor 4301 and is close to the second end 43012 of the motor 4301 in its length direction. Such a structure is conducive to achieving a good fixing effect of the motor 4301.

In one embodiment, referring to FIGS. 4 and 5, in order to fix the spacers 451, the inner surface of the upper casing 410 and the inner surface of the lower casing 420 are both protruded with a number of spacer holders 453, and a mounting groove 4531 is defined in the top of each spacer holder 453. Each spacer 451 includes an arc-shaped main body and a fixing rib on the back of the main body, and the fixing rib is tightly inserted into a corresponding mounting groove 4531, thereby fixing the spacer 451 to the spacer holder 453. Through such an arrangement, the spacers 451 are fixed and will not move to affect the shock absorption effect.

Similarly, in order to fix the spacers 452, the inner surface of the upper casing 410 and the inner surface of the lower casing 420 are both protruded with two spacer holders 454, and the top of each spacer holder 454 is provided with a mounting groove, and the spacers 452 are tightly inserted into the mounting grooves, thereby fixing the spacers 452 to the spacer holders 454. In one embodiment, in order to prevent relative movement between the spacers 452 and the cylinder 4302, the top and bottom surfaces of the cylinder 4302 facing the upper casing 410 and the lower casing 420 are both protruded with fixing ribs 43021 (see FIG. 5), and each gasket 452 is provided with a receiving groove, and the fixing ribs 43021 are tightly inserted into the receiving grooves, thereby preventing relative movement between the spacers 452 and the cylinder 4302. In one embodiment, the spacers 452 are in an elongated strip shape, which are adapted to the shape of the cylinder 4302.

In one embodiment, the control circuit board 200 is arranged on the cover 700. Specifically, two support members 710 are arranged on the upper surface of the cover 700, and the lower surface of the control circuit board 200 contacts the support members 710, so that the upper surface of the cover 700 is spaced a certain distance apart, which is beneficial to the heat dissipation of the control circuit board 200. The control circuit board 200 is securely connected to the upper casing 410 by a number of screws 240. In another embodiment, the control circuit board 200 may be securely connected to the cover 700, or securely connected to the lower casing 420.

Figure 3:
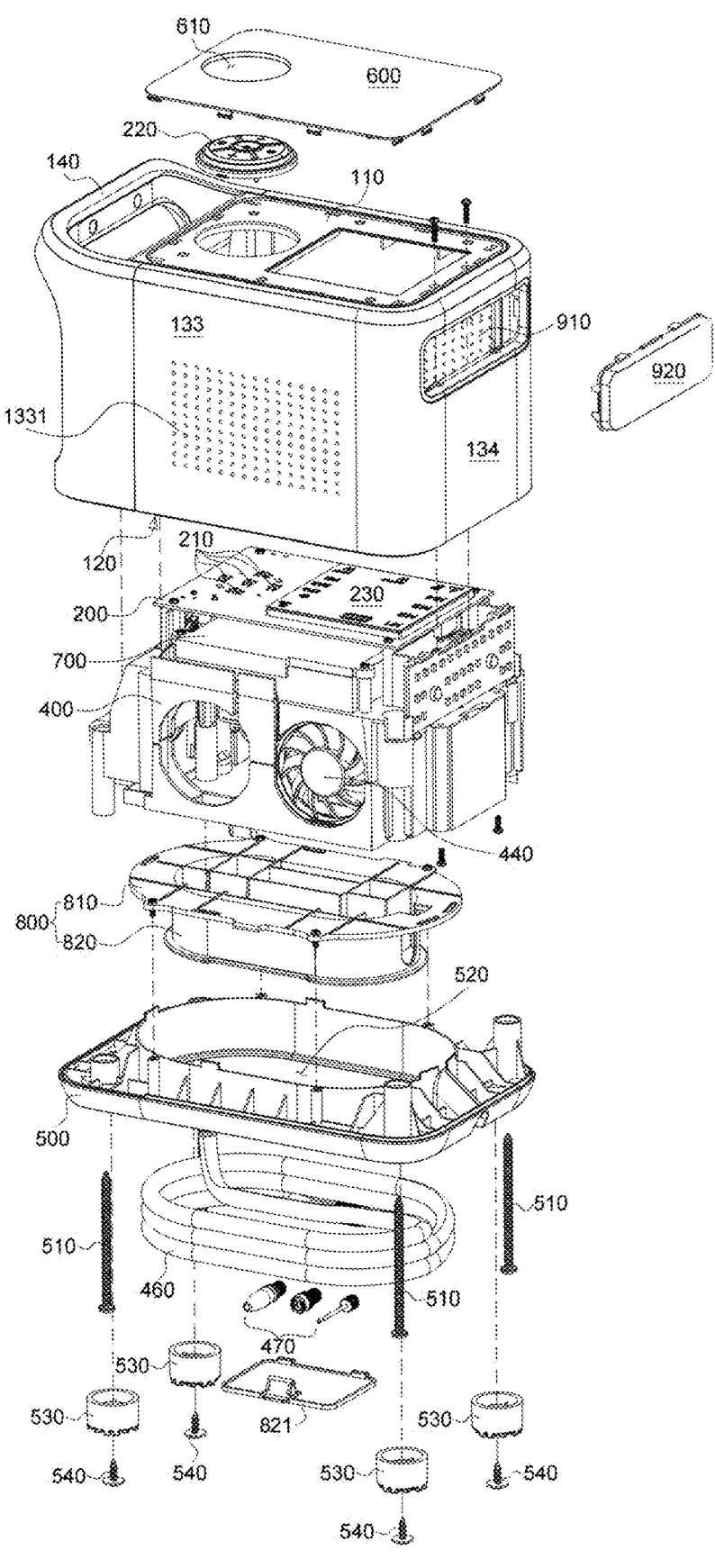
FIG. 3 is an isometric exploded view of the electric inflator according to one embodiment.
Figure 7:
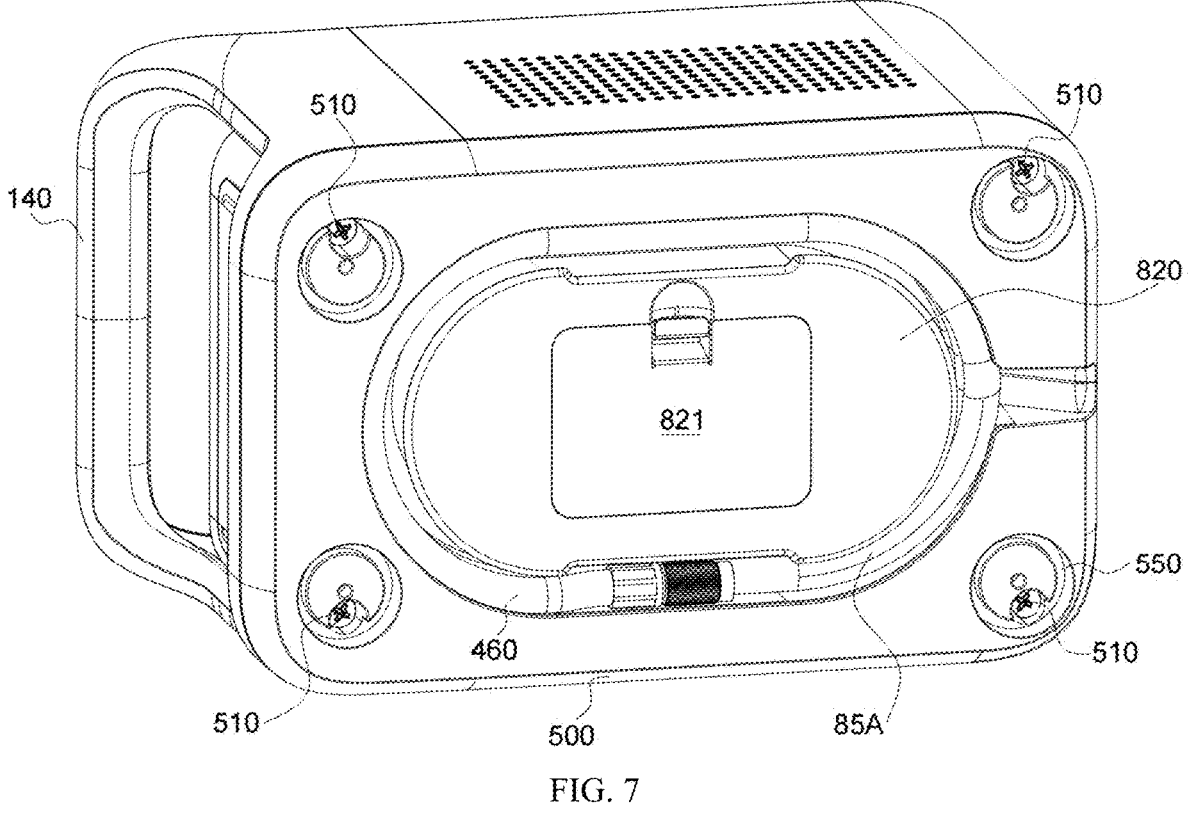
FIG. 7 is another isometric view of the electric inflator viewed from a different perspective.
Figure 8:
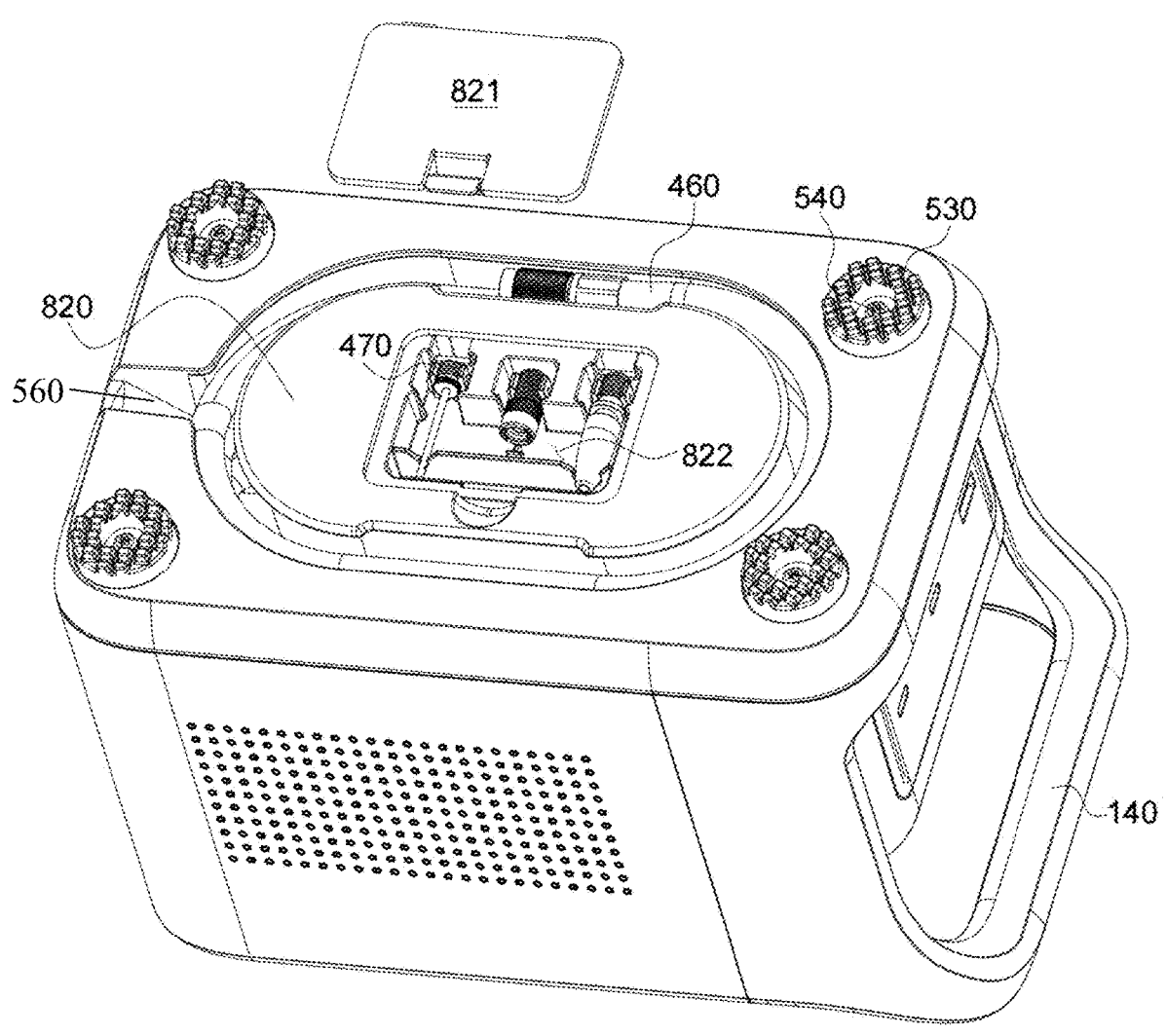
FIG. 8 is another isometric view of the electric inflator viewed from a different perspective, with a cover detached from the electric inflator.

As shown in FIGS. 3 and 7, the mounting member 500 is connected to the housing 100. In one embodiment, the mounting member 500 is arranged at the bottom of the housing 100. It should be noted that in another embodiment, the mounting member 500 can be connected to one side of the housing 100 instead of the bottom as needed. In one embodiment, the mounting member 500 can be securely connected to the upper casing 410 using a number of first threaded fasteners 510. In another embodiment, the mounting member 500 can be securely connected to the lower casing 420, or the mounting member 500 can be securely connected to both the upper casing 410 and the lower casing 420. The compressor assembly 400 further includes an inflator hose 460 having one end connected to the compressor 430. In order to accommodate the inflator hose 460, the inflator 10 further includes a reel 800. The reel 800 includes a base plate 810 and a drum 820 extending downward from the base plate 810. A receiving space 520 is defined in the center of the mounting member 500. In one embodiment, the receiving space 520 is a through hole that passes through the mounting member 500. The drum 820 is received in the receiving space 520, and an elliptical accommodating groove 85A is formed between the lateral surface of the drum 820 and the inner surface of the receiving space 520. The base plate 810 can be securely connected to the base 500 by screws or snap-fit connectors. In another embodiment, the base plate 810 can be securely connected to the upper casing 410 or the lower casing 420 by screws or snap-fit connectors. In the storage state, the inflator hose 460 is wrapped around the lateral surface of the drum 820 and received in the groove 85A. As shown in FIG. 8, in order to store accessories, such as different types of valve adapters 470 that may include but are not limited to a Schrader valve adapter (Note: the second end 462 of the inflator hose 460 is a Schrader valve adapter), a Dunlop valve adapter, a Presta valve adapter 4701, a basketball metal needle 4702, etc., a storage chamber 822 with an cover 821 is formed at the bottom of the drum 820, and the valve adapters 470 are received in the storage chamber 822.

Figure 15:
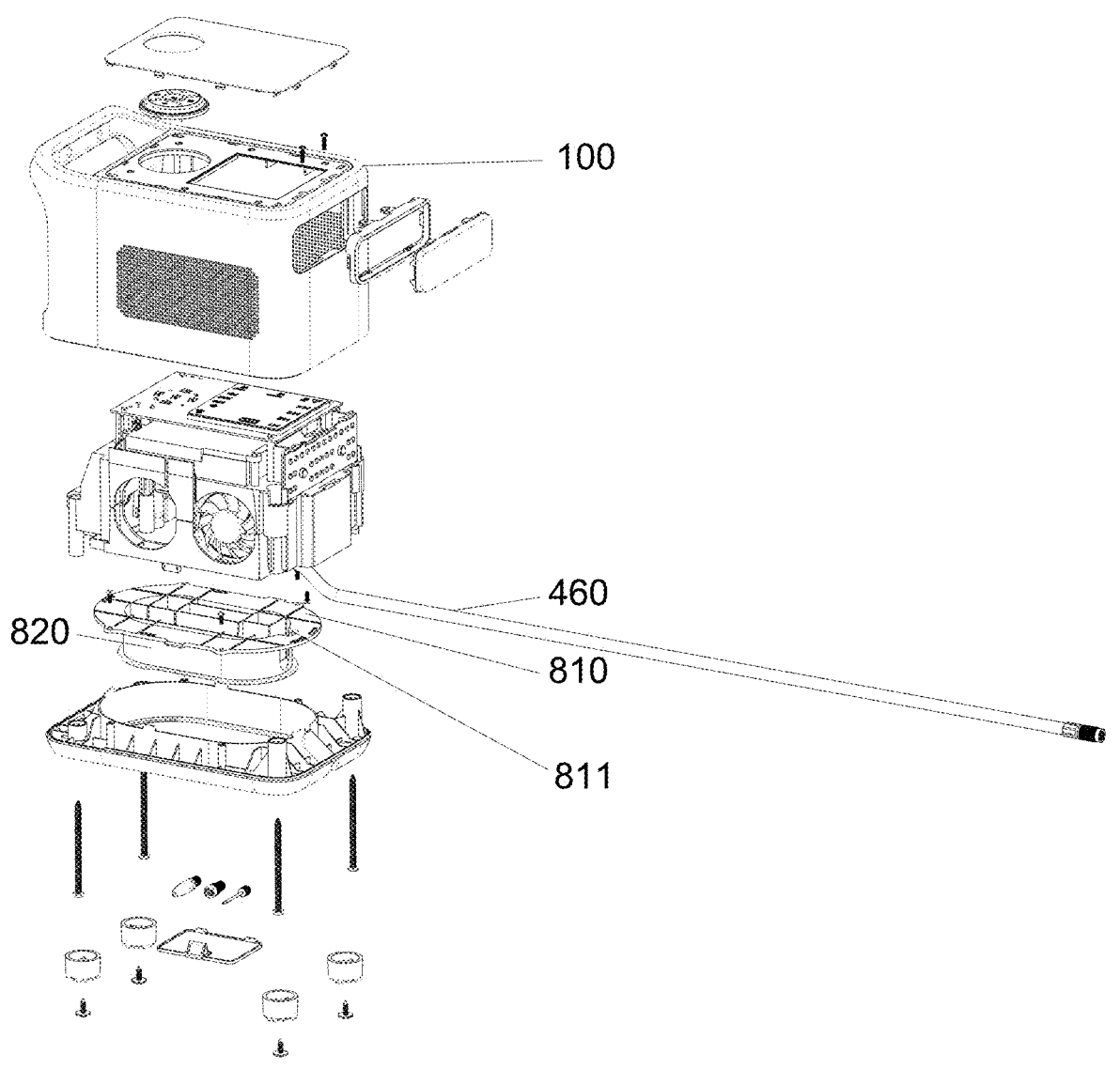
FIG. 15 is another isometric exploded view of the electric inflator.
Figure 17:
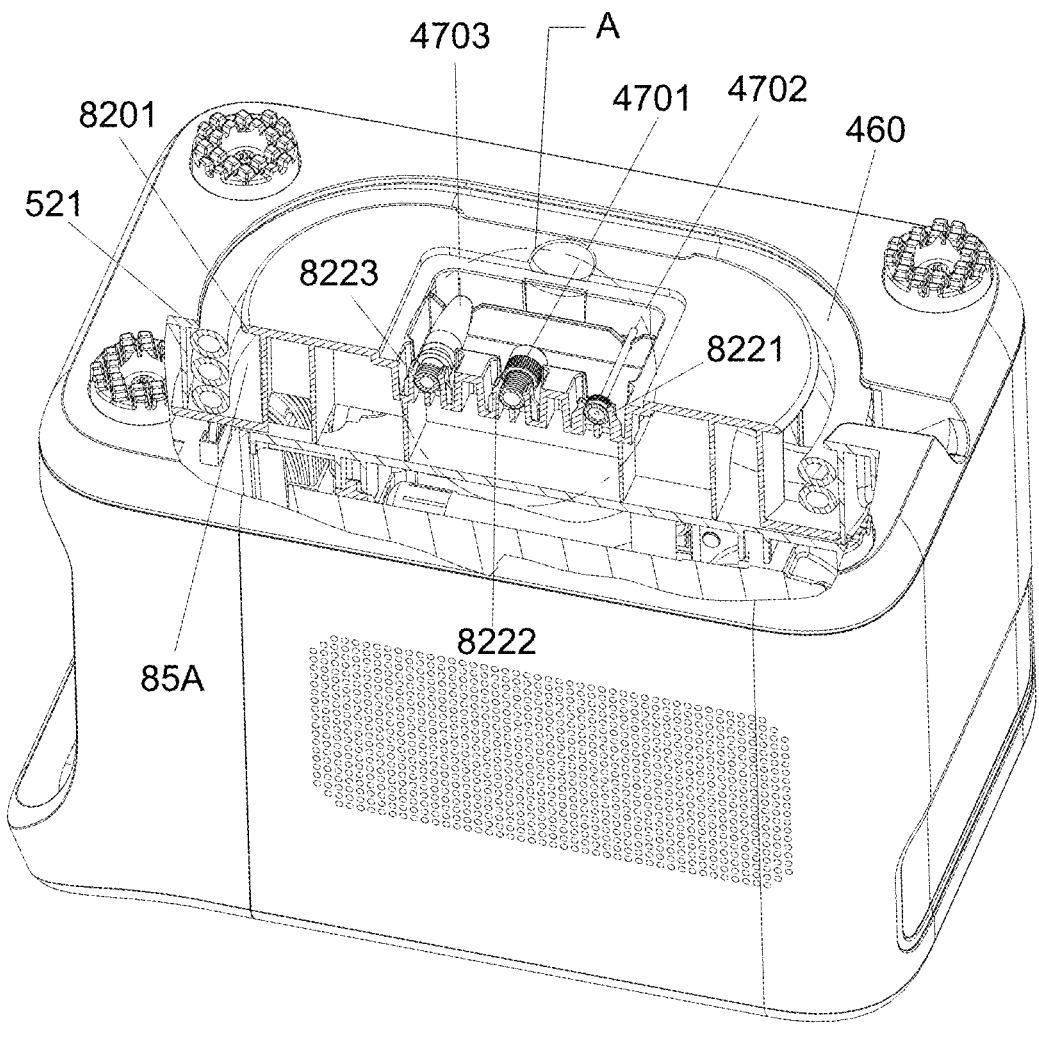
FIG. 17 is an isometric partially cross-sectional view of electric inflator.

Specifically, referring to FIG. 15, a through hole 811 is defined in the base plate 810, and the free end of the inflator hose 460 passes through the through hole 811, so that the inflator hose 460 can enter the groove 85A. Referring to FIGS. 8, 16 and 17, in one embodiment, the groove 85A is an annular groove with one end open, and the surface of the base plate 810 facing the mounting member 500 is the closed end of the groove 85A. In one embodiment, the inner lateral surface of the receiving space 520 protrudes inwardly at a position close to the bottom end, and the outer lateral surface of the drum 820 protrudes outwardly at a position close to the bottom end, and the outer flange 8201 is spaced apart from the inner flange 521 to form an opening 851 of the groove 85A. The inflator hose 460 received in the groove 85A is exposed through the opening 851. Furthermore, the lowermost loop of the inflator hose 46 received in the storage groove 85A (see FIG. 16) abuts against the outer flange 8201 or the inner flange 521, so that the inflator hose 46 will not be moved out of the storage groove 85A. When needed, a user can insert a finger through the opening 851 into the storage groove 85A, and then pinch the free end of the inflator hose 460 with two fingers to move the free end out of the storage groove 85A, and then the user can pull the inflator hose 460 to separate it from the drum 820 and be pulled out of the storage groove 85A. In another embodiment, the outer flange 8201 and the inner flange 521 can be omitted. In this case, corresponding to the opening 851 of the storage groove 85A, the mounting member 500 further includes a cap covering the opening 851, and the cap is detachably connected to the opening 851. When needed, a user can remove the cap from the opening 851 and then pull out the inflator hose 460.

Figure 11:
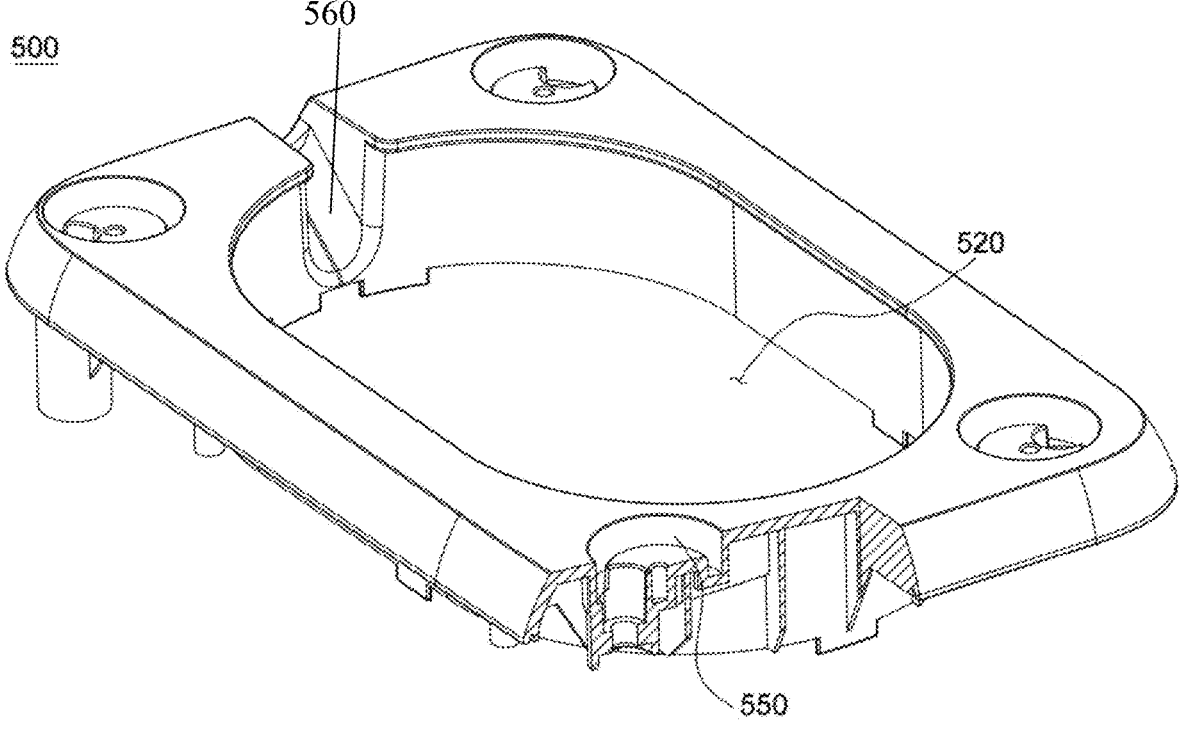
FIG. 11 is an isometric view of a mounting member of the electric inflator.

Referring to FIGS. 8 and 11, in one embodiment, the mounting member 500 is further provided with a guide groove 560 in communication with the receiving space 520. When the inflator hose 460 is needed, the inflator hose 460 pulled out from the groove 85A can pass through the guide groove 560 and extend from one side of the inflator. With such a configuration, it can avoid the inflator hose 460 pulled out from the groove 85A being sandwiched between the inflator and the supporting surface supporting the inflator, thereby affecting the stable placement of the inflator on the supporting surface.

With the above-mentioned structure, one end of the inflator hose 460 is securely connected to the compressor 430. Compared with an independent hose independent of the inflator 10, such a structure allows the user to no longer need to connect the inflator hose to the compressor when preparing to inflate an inflatable object. In addition, after the inflation is completed, the user does not need to remove the inflator hose 460 from the compressor. Since the temperature of the end of the hose connected to the compressor is usually very high (over 60 degrees) after the inflation is completed, the user does not need to remove the inflator hose 460 from the compressor, which helps to avoid burns to the user. The inflator hose 460 can be stored in the groove 85A when not in use, which can avoid the problem of the conventional hoses being lost after being removed.

Figure 18:
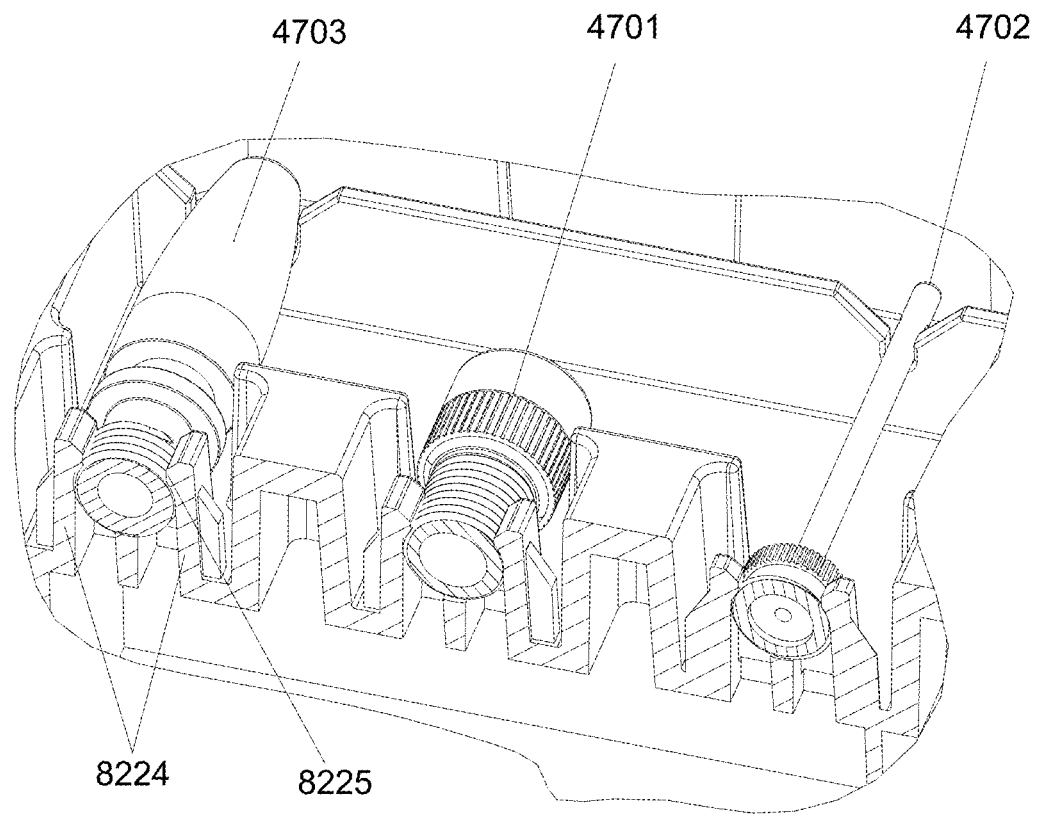
FIG. 18 is an enlarged view of a portion A in FIG. 17.

In one embodiment, referring to FIGS. 17 and 18, the bottom surface of the storage chamber 822 protrudes with a number of fixing members for fixing the valve adapters. For example, a fixing member 8221 for fixing the basketball metal needle 4702, a fixing member 8222 for fixing the Presta valve adapter 4701, and a fixing member 8223 for fixing the valve adapter 4703. These fixing members have basically the same structure. Specifically, they all include two mutually spaced protruding pieces 8224, and the two protruding pieces 8224 are provided with protrusions 8225 near the top of the surfaces facing each other. When fixing a valve adapter to a fixing member, a user places the valve adapter in the opening formed by the two protruding pieces and applies pressure, and the two protruding pieces are elastically deflected by the pressure of the valve adapter until the valve adapter moves to the desired position. At this time, the protrusions on the two protruding pieces are tightly pressed on the valve adapter, thereby fixing the valve adapter in place.

Through the above-mentioned structure, the valve adapters can be conveniently fixed in the storage chamber 822, which is convenient for users to use and avoids the risk of losing the valve adapters.

Figure 9:
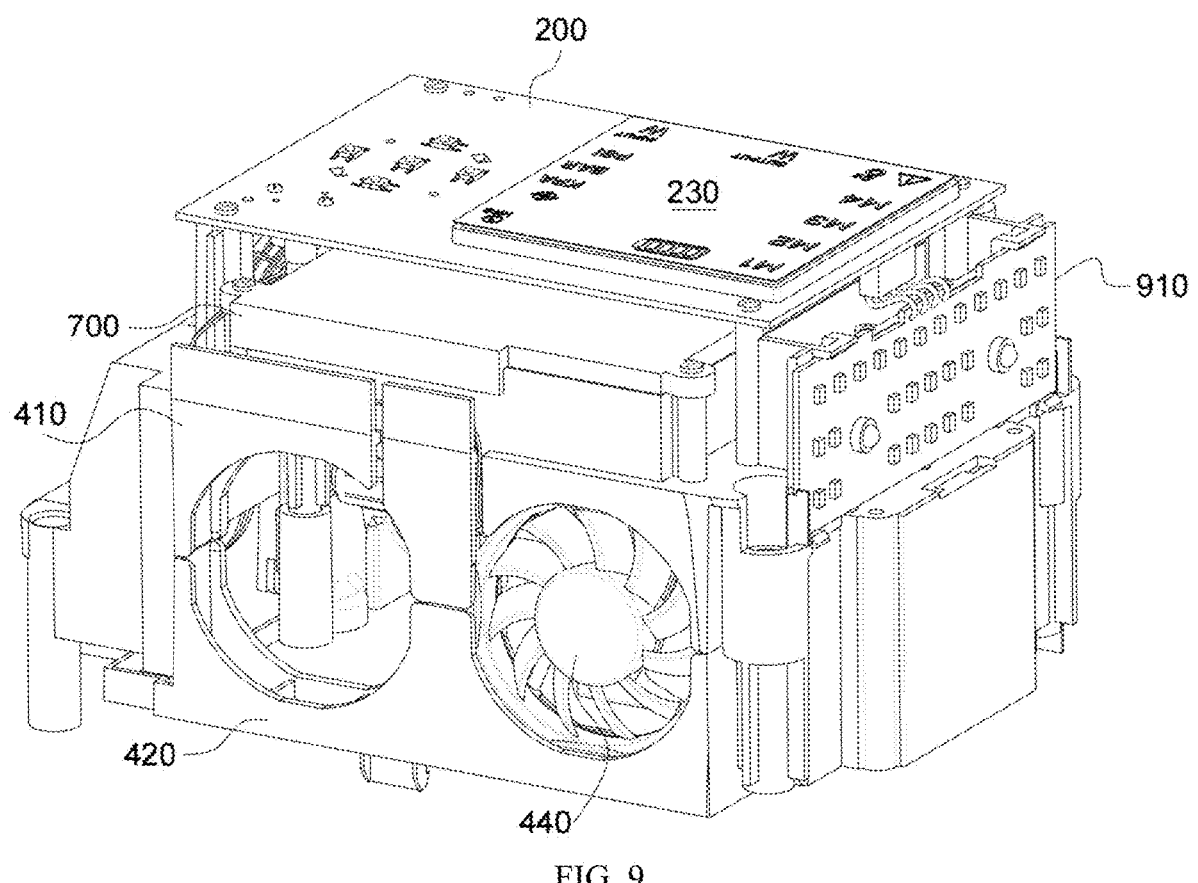
FIG. 9 is another isometric view of the assembly in FIG. 3 viewed from a different perspective.

As shown in FIGS. 3, 4 and 9, in one embodiment, the inflator 10 further includes a lighting module, which includes a mainboard 910 and a lampshade 920. The mainboard 910 includes a circuit board 911 electrically connected to the control circuit board 200, two large white light beads 912 and a number of warm-colored small lamp beads 913 arranged on the circuit board 911. The mainboard 910 can be securely connected to the upper housing 410 by snap-fitting, and the fourth sidewall 134 of the housing 100 is formed with a light-transmitting window, and the mainboard 910 is arranged facing the light-transmitting window. The lampshade 920 can be fixed to the fourth sidewall 134 of the housing 100 by snap-fitting, and covers the light-transmitting window.

As shown in FIGS. 2 and 4-6, in one embodiment, the inflator 10 further includes a charge and discharge interface module 930 that includes a USB-A output interface 931, a USB-C output interface 932 and a USB-C input/output interface 933. The USB-A output interface 931, the USB-C output interface 932 and the USB-C input/output interface 933 are exposed from the first sidewall 131 of the housing 100.

Figure 10:
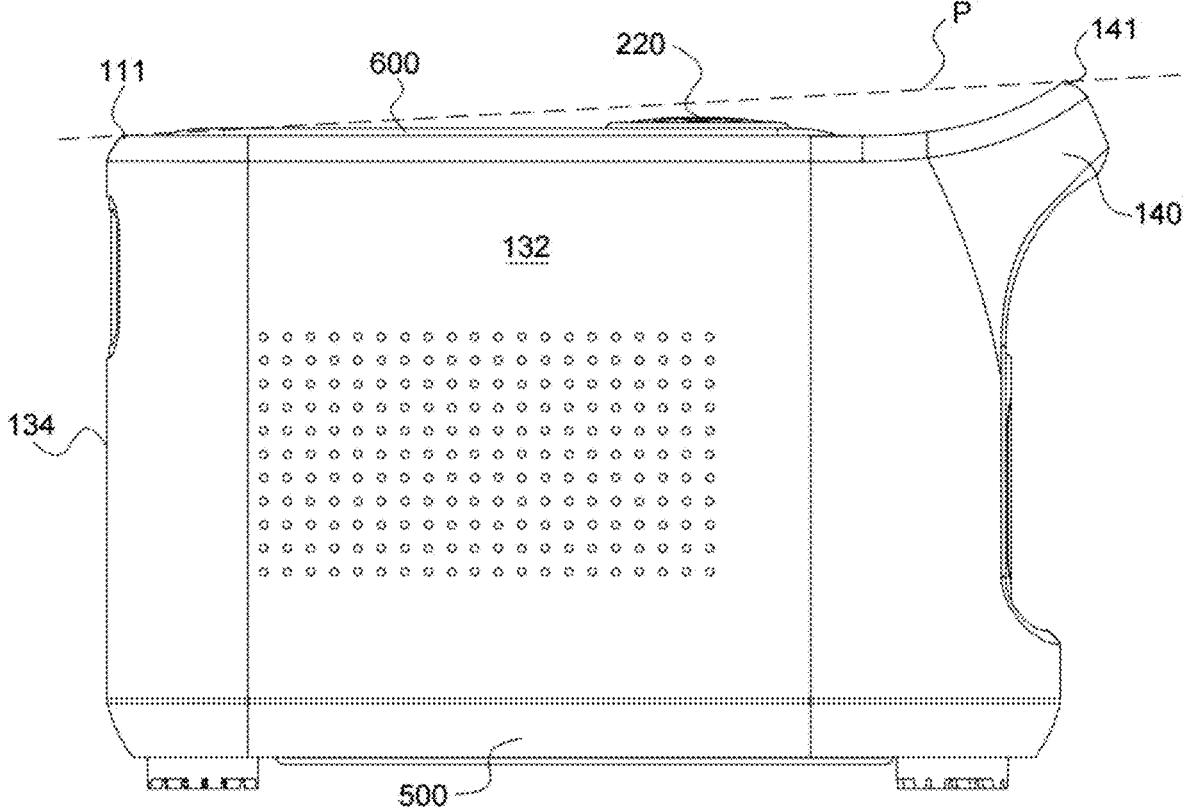
FIG. 10 is a side view of the electric inflator.

As shown in FIGS. 1 and 10, the handle 140 has a first top 141 away from the mounting member 500. The intersection of the top end face 110 and the fourth sidewall 134 has a second top 111, and the first top 141 and the second top 111 are located in the same plane P. The button panel 220 is located below the plane P. In an incorrect usage scenario, when the inflator 10 is inverted on the ground (i.e., when the light-transmitting panel 600 faces the ground), the ground is temporarily regarded as the plane P, and the button panel 220 will not contact the ground, thereby preventing the button panel 220 from being accidentally depressed.

As shown in FIGS. 3, 7, 8 and 11, in order to achieve a shock-absorbing effect, in one embodiment, a number of shock-absorbing foot pads 530 are fixed to the bottom of the mounting member 500, and the shock-absorbing foot pads 530 can be fixed to the bottom of the mounting member 500 by a number of second threaded fasteners 540. Specifically, a number of receiving holes 550 are defined in the bottom of the mounting member 500, and each shock-absorbing foot pad 530 is partly received in a corresponding receiving hole 550. The second threaded fasteners 540 are located at the centers of the receiving holes 550, and the first threaded fasteners 510 are spaced apart from the centers of the receiving holes 550. When the shock-absorbing foot pads 530 are partly received in the receiving holes 550 and are fixed to the bottom of the mounting member 500 by the second threaded fasteners 540, the shock-absorbing foot pads 530 shield the ends of the first threaded fasteners 510, so that the ends of the first threaded fasteners 510 are not exposed at the bottom of the mounting member 500.

Figure 12:
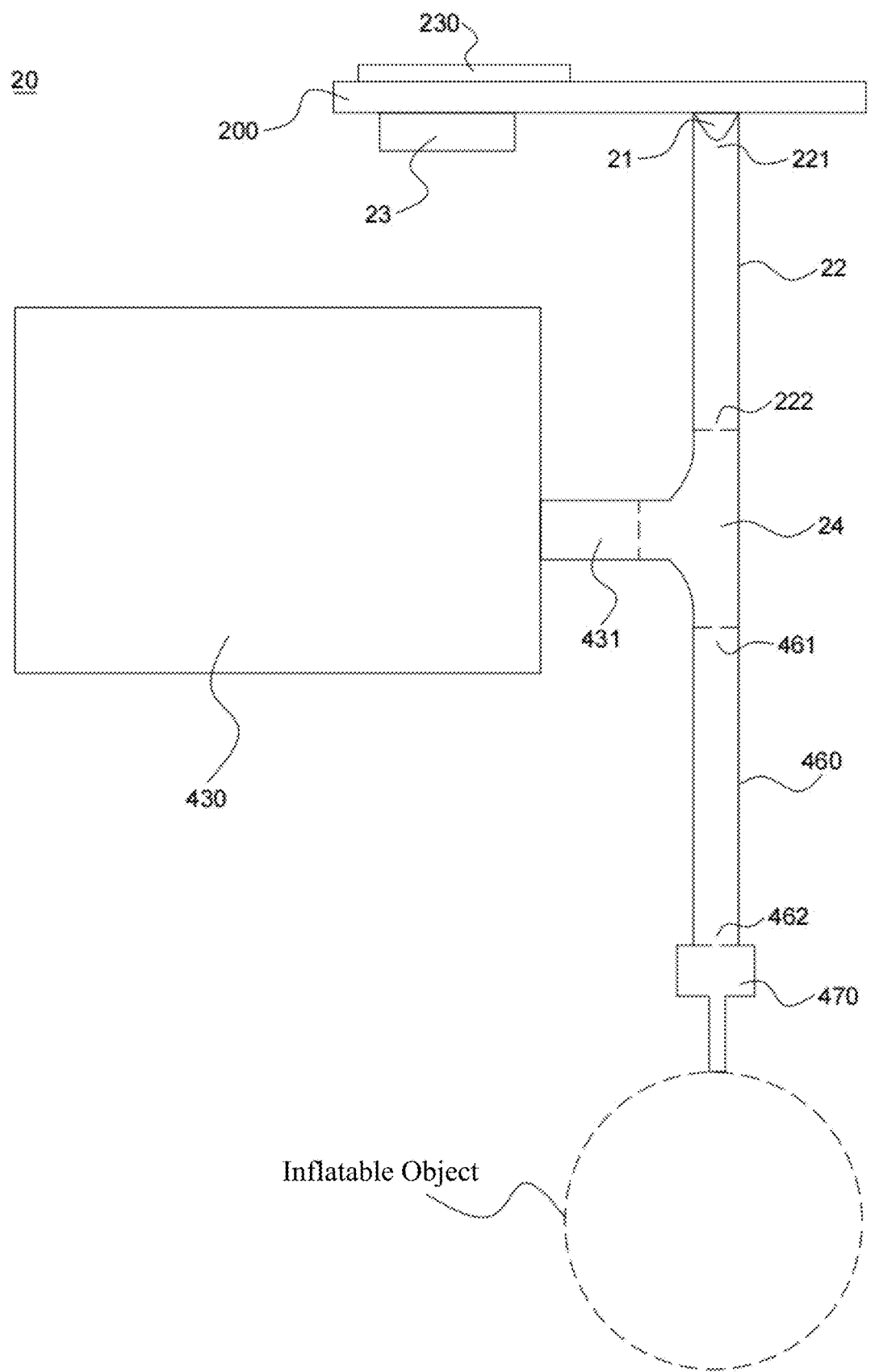
FIG. 12 is a schematic diagram of an inflator according to one embodiment.

As shown in FIG. 12, in one embodiment, the present disclosure further provides an inflator 20, which is to deliver compressed air to an object. The object may include a tire, a ball, an inflatable toy, an inflatable mattress, etc. The inflator 20 may include the compressor 430, a valve adapter 470, the inflator hose 460, an air pressure sensor 21, a detection air pipe 22, a control unit 23, and the display 230.

Referring to FIG. 4, when the compressor 430 is working, it compresses the air and outputs the compressed air through the inflator hose 431. The first end 461 of the inflator hose 460 is connected to the air outlet 431 of the compressor 430, and the second end 462 of the inflator hose 460 is securely or detachably connected with the valve adapter 470. When the object needs to be inflated, if the object itself is equipped with a Schrader valve, the second end 462 of the inflator hose can be directly connected to Schrader valve. If the valve stem on the object is not a Schrader valve, a corresponding valve adapter 470 needs to be connected to the second end 462 of the inflator hose 460 before being connected to the object.

The first end 221 of the detection air pipe 22 is connected to the air pressure sensor 21, and the second end 222 of the detection air pipe 22 is connected to the air outlet 431 of the compressor 430 and the first end 461 of the inflator hose 460. In one embodiment, the inflator 20 further includes a three-way connector 24. The first port of the three-way connector 24 is connected to the air outlet 431 of the compressor 430, the second port 2401 (see FIGS. 4 and 5) of the three-way connector 24 is connected to the first end 461 of the inflator hose 460, and the third port of the three-way connector 24 is connected to the second end 222 of the detection air pipe 22. In one embodiment, the air pressure sensor 21 has an air pressure detection range, for example, 3 PSI~150 PSI. When the pressure value to be detected is within the range of 3 PSI to 50 PSI, the pressure sensor 21 has a detection accuracy of ±1 PSI; when the pressure value is within the range of 50 PSI to 100 PSI, the accuracy is ±2 PSI; and when the pressure value is within the range of 100 PSI to 150 PSI, the accuracy is ±3 PSI.

Referring to FIGS. 4 and 5, in one embodiment, the lower casing 420 is provided with a through hole 4201 for the inflator hose 460 to pass through. After the first end 461 of the inflator hose 460 is connected to the second port 2401 of the three-way connector 24, the free end of the inflator hose 460 can pass through the through hole 4201, so that most of the air outlet pipe 460 is located outside the lower casing 420. In one embodiment, the outer surface of the lower casing 420 is further provided with two guide members 4202, such as two hooks protruding from the outer surface of the lower casing 420 in FIG. 5. The two hooks 4202 are arranged along the lengthwise direction of the lower casing 420. Under the guidance of the two hooks 4202, the inflator hose 460 extends from one end to the other end along the length direction of the lower casing 420. Thereafter, the free end of the inflator hose 460 can pass through the through hole 811 on the base plate 810 located below the lower casing 420, and then enter the storage groove 85A.

In one embodiment, the air pressure sensor 21, the control unit 23 and the display 230 are all integrated on the control circuit board 200, and the control unit 23 is electrically connected to the air pressure sensor 21 and the display 230. The display 230 is arranged on the upper surface of the control circuit board 200. In order to facilitate the connection with the first end 221 of the detection air pipe 22, the air pressure sensor 21 is arranged on the back of the control circuit board 200. In another embodiment, the air pressure sensor 21, the control unit 23 and the display 230 can be separately arranged on different circuit boards.

In an actual application scenario, when the valve adapter 470 is connected to an inflatable object, and the air pressure sensor 21, the control unit 23, and the display 230 all start working, the air pressure sensor 21 can detect the current air pressure of the object when the compressor 430 does not output compressed air, so that the user can know the air pressure value of the object before inflation.

In another actual application scenario, when the valve adapter 470 is connected to an inflatable object, and the compressor 430, the air pressure sensor 21, the control unit 23, and the display 230 all start working, the air pressure sensor 21 can detect the real-time air pressure of the object during the process of the compressor 430 outputting compressed air, so that the user can know the air pressure value of the object during inflation.

In one embodiment, the control unit 23 receives a first signal from the pressure sensor 21 that characterizes the real-time pressure and a second signal that characterizes the current pressure. It converts the first signal into a first digital display signal and the second signal into a second digital display signal. The display 230 can then show the real-time pressure based on the first digital display signal and the current pressure based on the second digital display signal.

Figure 13:
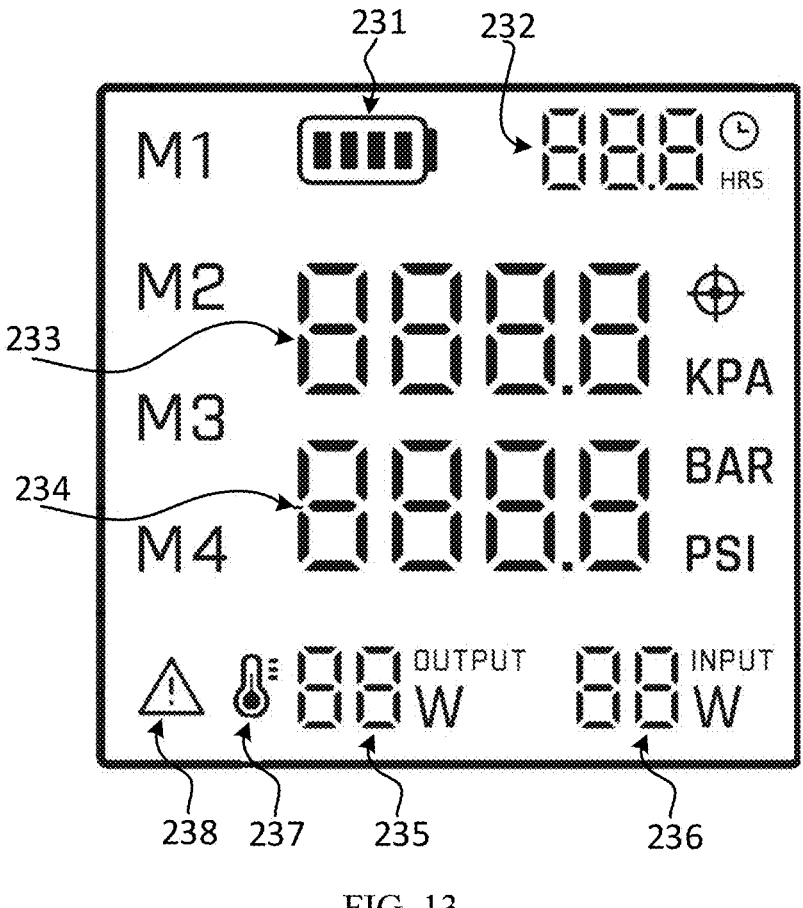
FIG. 13 is a schematic diagram of visual information displayed by a display of the inflator.

As shown in FIG. 13, the display 230 can present visual information on various content, including: four adjustable memory pressure mode indicators (M1, M2, M3, and M4), a manual pressure mode indicator (not shown), a battery level indicator 231, a charging time indicator 232, a target pressure setting indicator 233, a real-time pressure indicator 234, a pressure unit indicator (KPA, BAR, and PSI), an output power indicator 235, an input power indicator 236, a high temperature indicator 237, and an overload protection indicator 238.

Figure 14:
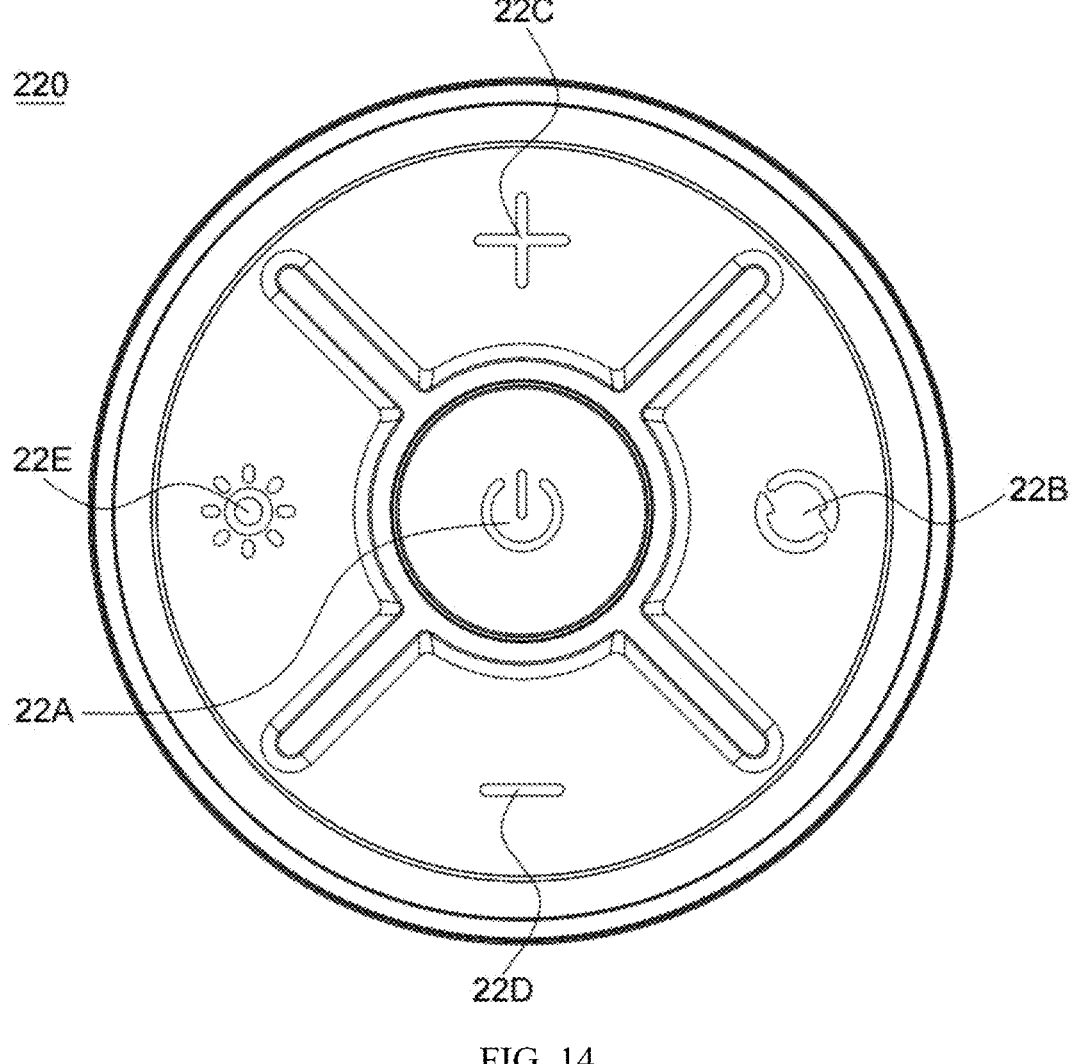
FIG. 14 is a front view of a button panel of the inflator according to one embodiment.

As shown in FIG. 14, the button panel 220 includes multiple buttons, including: a start/stop button 22A, a unit/mode button 22B, an increase pressure button 22C, a decrease pressure button 22D, and a light button 22E. When depressed by a user, the start/stop button 22A, unit/mode button 22B, increase pressure button 22C, decrease pressure button 22D, and light button 22E respectively actuate the multiple switches 210 arranged on the control circuit board 200. Specifically, the start/stop button 22A is to turn on or off the inflator when depressed. The unit/mode button 22B is to switch the air pressure unit when depressed, causing the current air pressure unit to be displayed through the air pressure unit indicators (KPA, BAR, and PSI). The increase pressure button 22C is to increase the air pressure to a target value when depressed in the manual pressure mode or the adjustable memory pressure mode. The decrease pressure button 22D is to reduce the air pressure to a target value when depressed in the manual pressure mode or the adjustable memory pressure mode. The light button 22E is to activate or deactivate the lighting function of the mainboard 910 when depressed. When the lighting function of the mainboard 910 is activated, the light button 22E is further to switch the light beads between a lighting mode and an SOS mode.

In one embodiment, when the start/stop button 22A is long pressed, the inflator is turned on and is then in a standby state. When the inflator is in the standby state, the start/stop button 22A can be depressed to control the compressor 430 to output compressed air. If the inflator is not used within a preset time (e.g., five minutes) while in standby mode, it will automatically turn off. For example, if the start/stop button

22A receives no input from a user to control the compressor 430 to output compressed air within the preset time, the inflator will automatically turn off. In another example, the light button 22E receives no input from a user to activate the lighting function of the mainboard 910, the inflator will automatically turn off. In yet another example, if the charge and discharge interface module 930 does not discharge within the preset time, the inflator will automatically turn off. When the inflator is in standby mode and the start/stop button 22A is long pressed, the inflator will turn off.

The unit/mode button 22B is to switch the air pressure unit when depressed, causing the current air pressure unit to be displayed through the air pressure unit indicators. The current air pressure unit can be any one of KPA, BAR and PSI. In one embodiment, when the inflator is in the standby state, the air pressure unit can be changed by depressing the unit/mode button 22B. That is, a desired air pressure unit may be selected by depressing the unit/mode button 22B multiple times.

The unit/mode button 22B is further to change the adjustable memory air pressure mode when depressed, and the current adjustable memory air pressure mode is displayed through the adjustable memory air pressure mode indicator. The current adjustable memory air pressure mode can be any one of M1, M2, M3 and M4. In one embodiment, when the inflator is in the standby mode, the adjustable memory air pressure mode can be changed by depressing the unit/mode button 22B, and a desired adjustable memory air pressure mode can be selected by depressing the unit/mode button 22B multiple times. After a desired adjustable memory air pressure mode is selected, the air pressure can be increased or decreased to a target value by depressing the increase pressure button 22C or the decrease pressure button 22D. For example, a user can set the target air pressure value under the adjustable memory air pressure mode M1 to 90 KPA that is suitable for a football. The inflator saves the target air pressure value under the adjustable memory air pressure mode M1 as 90 KPA, which is convenient for the user to directly select the adjustable memory air pressure mode M1 to inflate the football next time. In another example, a user can set the target air pressure value under the adjustable memory air pressure mode M2 to 230 KPA that is suitable for tires of a car. The inflator saves the target air pressure value under the adjustable memory air pressure mode M2 as 230 KP, so that the user can directly select the adjustable memory air pressure mode M2 to inflate the tires of the car.

The target air pressure indicator 233 is to display the target air pressure value in the manual air pressure mode or the adjustable memory air pressure mode. The real-time air pressure indicator 234 is to display the real-time air pressure value in the manual air pressure mode or the adjustable memory air pressure mode. The real-time air pressure value represented by the real-time air pressure indicator 234 can be the real-time air pressure value of the inflatable object during the process of the compressor 430 outputting compressed air or the current air pressure value of the inflatable object when the compressor 430 does not output compressed air.

In one embodiment, in the manual air pressure mode or the adjustable memory air pressure mode, during the process of the compressor 430 outputting compressed air to the inflatable object, when the air pressure value detected by the air pressure sensor 21 reaches the target air pressure value, the compressor 430 automatically stops outputting compressed air. Then the air pressure sensor 21 continuously detects the air pressure value, and when the air pressure value detected by the air pressure sensor 21 is less than the target air pressure value, the compressor 430 automatically starts working and outputs compressed air. During the process of the compressor 430 outputting compressed air to the inflatable object, the compressor 430 can be manually controlled to stop outputting compressed air, for example, in response to a depress of the start-stop button 22A.

In one embodiment, when the high temperature indicator 237 is on, the inflator will stop working. When the temperature drops, the high temperature indicator 237 goes out, and the inflator can return to normal working state. When the compressor 430 outputs compressed air to the inflatable object, if the internal current of the inflator exceeds a protection current value, the power-off protection will be triggered, causing the overload protection indicator 238 to light up. In addition, when a short circuit occurs inside the inflator, the power-off protection will also be triggered, causing the overload protection indicator 238 to light up.

In one embodiment, in addition to providing power to the compressor 430, the battery module 300 can serve an energy storage power source to provide power to external devices, which may include but are not limited to mobile phones, laptops, portable drones, etc. The battery power indicator 231 can display the battery level of the battery module 300 when the inflator is charging and discharging. When the battery module 300 of the inflator is charged, the charging time indicator 232 will display the estimated time to full charge, and the input power indicator 236 will display the input power during charging. When the battery module 300 of the inflator discharges to an external device, the output power indicator 235 will display the output power during the discharge.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An inflator with an energy storage power source, comprising:
    a housing comprising a top end face, a bottom end face and a plurality of sidewalls between the top end face and the bottom end face;
    a control circuit board arranged within the housing, the control circuit board comprising a display mounted thereon, and the display configured to display information that is viewable by a user from the top end face;
    a compressor assembly arranged within the housing and comprising a casing, a compressor arranged within the casing, and an inflator hose connected to the compressor;
    a battery module arranged within the housing and electrically connected to the control circuit board and the compressor; and
    a mounting member connected to the housing, the mounting member defining a receiving space in communication with an internal space of the casing, and the receiving space configured to receive the inflator hose.

2. The inflator of claim 1, further comprising a light-transmitting panel arranged on the top end face of the housing, wherein an area covered by the light-transmitting panel is greater than two-thirds of an area of the top end face of the housing.

3. The inflator of claim 2, wherein the control circuit board comprises one or more switches, the housing further comprises a button panel that is configured to actuate the one or more switches, and the light-transmitting panel defines a through hole to expose the button panel.

4. The inflator of claim 1 further comprising a handle connected to the top end face or one or more of the sidewalls.

5. The inflator of claim 4, wherein the plurality of sidewalls comprises a first sidewall, a second side wall, a third sidewall and a fourth sidewall, the first sidewall is disposed opposite to the fourth sidewall, the second sidewall is disposed opposite to the third sidewall, the handle is arranged adjacent to the first sidewall and extends from the second sidewall to the third sidewall.

6. The inflator of claim 1, wherein the compressor assembly further comprises one or more dissipation fans that are arranged within the casing and electrically connected to the battery module.

7. The inflator of claim 1, wherein the casing comprises an upper casing, a lower casing and a cover, the upper casing and the lower casing are connected to each other, the upper casing defines a battery chamber in a top thereof, the cover is configured to cover the battery chamber, and the battery module is received in the battery chamber.

8. The inflator of claim 7, wherein the control circuit board is arranged on the cover.

9. The inflator of claim 1, further comprising a plurality of first fasteners and a plurality of shocking absorbing foot pads, wherein the casing comprises an upper casing and a lower casing that are connected to each other, the first fasteners are configured to connect the upper casing to the lower casing and/or connect the mounting member to the lower casing; the shocking absorbing foot pads are fixed to a bottom of the lower casing and shields a portion or all of the first fasteners that connect the mounting member to the lower casing.

10. The inflator of claim 9, further comprising a plurality of second fasteners that are configured to connect the shocking absorbing foot pads to the lower casing.

11. An inflator with an energy storage power source, comprising:
    a housing comprising a top end face, a bottom end face and a plurality of sidewalls between the top end face and the bottom end face;
    a control circuit board arranged within the housing;
    a compressor assembly arranged within the housing and comprising a casing, a compressor arranged within the casing, an inflator hose connected to the compressor, and one or more spacers arranged between the compressor and the casing;
    a battery module arranged within the housing and electrically connected to the control circuit board and the compressor; and
    a mounting member connected to the housing, the mounting member defining a receiving space in communication with an internal space of the casing, and the receiving space configured to receive the inflator hose.

12. The inflator of claim 11, wherein the one or more spacers are made of elastic material.

13. The inflator of claim 11, wherein the casing defines or more mounting grooves to receive the one or more spacers therein.

14. The inflator of claim 11, wherein the compressor comprises a motor having a cylindrical lateral surface, the one or more spacers are arc-shaped such that the one or more spacers are in contact with the cylindrical lateral surface of the motor.

15. The inflator of claim 11, wherein the one or more spacers comprise a first pair of spacers and a second pair of spacers, the first pair of spacers and the second pair spacers and arranged along a lengthwise direction of the compressor and adjacent to opposite ends of the compressor.

16. The inflator of claim 11, wherein the one or more spacers, the battery module and the compressor are arranged in such a manner that the one or more spacers are located between the battery module and the compressor to separate the battery module from the compressor.

17. The inflator of claim 11, wherein the casing defines a plurality of ventilation holes that allow airflow to flow over the compressor.

18. The inflator of claim 11, wherein the casing comprises an upper casing and a lower casing that are connected to each other, the compressor is arranged within an internal space formed by the upper casing, the upper casing defines a battery chamber in a top thereof, the battery chamber is isolated from the internal space, the casing further comprises a cover that is configured to cover the battery chamber, and the battery module is received in the battery chamber.

19. An electric inflator comprising:
a housing comprising a top end face, a bottom end face and a plurality of sidewalls between the top end face and the bottom end face;
a control circuit board arrange within the housing;
a compressor assembly arranged within the housing and comprising a casing, a compressor and an inflator hose connected to the compressor;
a battery module arranged within the housing and electrically connected to the control circuit board and the compressor; and
a mounting member connected to the housing, the mounting member defining a receiving space in communication with an internal space of the casing, and the receiving space configured to receive the inflator hose.

20. The electric inflator of claim 19, further comprising a reel, wherein the reel comprises a base plate and a drum protruding from the base plate, the base plate is fixed to the base plate, the drum is received in the receiving space, a lateral surface of the drum and an inner lateral surface of the receiving space form an open-ended accommodation groove.

* * * * *